US012794440B2

(12) United States Patent
Nakao et al.

(10) Patent No.: US 12,794,440 B2
(45) Date of Patent: Nov. 10, 2026

(54) ACOUSTIC WAVE DEVICE

(71) Applicant: Murata Manufacturing Co., Ltd., Nagaokakyo (JP)

(72) Inventors: Takeshi Nakao, Nagaokakyo (JP); Seiji Kai, Nagaokakyo (JP); Hisashi Yamazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 618 days.

(21) Appl. No.: 18/374,114

(22) Filed: Sep. 28, 2023

(65) Prior Publication Data

US 2024/0030890 A1 Jan. 25, 2024

Related U.S. Application Data

(63) Continuation of application No. PCT/JP2022/016188, filed on Mar. 30, 2022.

(Continued)

(51) Int. Cl.

| | |
|---|---|
| ***H03H 9/02*** | (2006.01) |
| ***H03H 9/13*** | (2006.01) |
| ***H03H 9/205*** | (2006.01) |

(52) U.S. Cl.

CPC .... *H03H 9/02228* (2013.01); *H03H 9/02015* (2013.01); *H03H 9/02157* (2013.01); *H03H 9/132* (2013.01); *H03H 9/205* (2013.01)

(58) Field of Classification Search

CPC ............... H03H 9/132; H03H 9/02015; H03H 9/02157; H03H 9/205; H03H 9/02062;

(Continued)

(56) References Cited

U.S. PATENT DOCUMENTS

| | | | | |
|---|---|---|---|---|
| 11,456,716 | B2 * | 9/2022 | Matsumoto | H03H 9/25 |
| 11,799,443 | B2 * | 10/2023 | Omura | H03H 9/64 |

(Continued)

FOREIGN PATENT DOCUMENTS

| | | |
|---|---|---|
| JP | 2012257019 A | 12/2012 |
| JP | 2016123020 A | 7/2016 |

(Continued)

OTHER PUBLICATIONS

International Search Report in PCT/JP2022/016188, mailed Jun. 14, 2022, 3 pages.

(Continued)

*Primary Examiner* — Pedro J Cuevas

(74) *Attorney, Agent, or Firm* — Keating & Bennett, LLP

(57) ABSTRACT

An acoustic wave device includes a piezoelectric substrate including a support and a piezoelectric layer on the support and including first and second main surfaces, one or more functional electrodes on the first or second main surfaces, and including at least one pair of electrodes, a first support surrounding the functional electrodes, one or more second supports on the piezoelectric substrate and on a portion surrounded by the first support, and a cover on the first and second supports. A direction in which adjacent electrodes face each other is an electrode facing direction, a region in which the adjacent electrodes overlap each other when viewed from the electrode facing direction is an intersecting region, a direction in which at least one pair of electrodes extend is an electrode extending direction, and the second support at least partially overlaps the intersecting region when viewed from the electrode extending direction.

25 Claims, 11 Drawing Sheets

Related U.S. Application Data

(60) Provisional application No. 63/168,314, filed on Mar. 31, 2021.

(58) Field of Classification Search
CPC .... H03H 9/0514; H03H 9/1035; H03H 9/568; H03H 9/02228
See application file for complete search history.

(56) References Cited

U.S. PATENT DOCUMENTS

| | | | | |
|---|---|---|---|---|
| 12,034,427 | B2 * | 7/2024 | Nagatomo | H03H 9/02015 |
| 12,355,427 | B2 * | 7/2025 | Yamane | H03H 9/587 |
| 12,413,200 | B2 * | 9/2025 | Inoue | H03H 9/174 |
| 12,413,203 | B2 * | 9/2025 | Kimura | H03H 9/568 |
| 12,431,863 | B2 * | 9/2025 | Kimura | H03H 9/14541 |
| 12,470,197 | B2 * | 11/2025 | Kimura | H03H 9/02015 |
| 12,537,504 | B2 * | 1/2026 | Ouchi | H03H 9/02228 |
| 2014/0152145 | A1 | 6/2014 | Kando et al. | |
| 2017/0093367 | A1 * | 3/2017 | Mimura | H03H 9/17 |
| 2018/0102755 | A1 * | 4/2018 | Takamine | H03H 9/02086 |
| 2018/0212581 | A1 * | 7/2018 | Matsumoto | H03H 9/02535 |
| 2019/0305746 | A1 | 10/2019 | Ota | |
| 2019/0334499 | A1 * | 10/2019 | Koyanagi | H03H 9/02834 |
| 2019/0341905 | A1 * | 11/2019 | Mimura | H03H 9/02858 |
| 2020/0321939 | A1 | 10/2020 | Turner et al. | |
| 2021/0297060 | A1 * | 9/2021 | Omura | H03H 9/564 |
| 2021/0408994 | A1 * | 12/2021 | Nagatomo | H03H 9/02228 |
| 2023/0141873 | A1 * | 5/2023 | Yamane | H03H 9/587 333/189 |
| 2023/0155565 | A1 * | 5/2023 | Ouchi | H03H 9/02228 310/363 |
| 2023/0275562 | A1 * | 8/2023 | Kimura | H03H 9/175 |
| 2023/0283259 | A1 * | 9/2023 | Kimura | H03H 9/02228 333/24 R |
| 2023/0327639 | A1 * | 10/2023 | Inoue | H03H 9/02086 333/187 |
| 2023/0336140 | A1 * | 10/2023 | Inoue | H03H 9/02062 |
| 2023/0336143 | A1 * | 10/2023 | Kimura | H03H 9/02228 |
| 2024/0014799 | A1 * | 1/2024 | Nakao | H03H 9/605 |
| 2024/0030886 | A1 * | 1/2024 | Inoue | H03H 9/568 |
| 2024/0030893 | A1 * | 1/2024 | Nakao | H03H 9/02062 |
| 2024/0154595 | A1 * | 5/2024 | Daimon | H03H 9/02031 |
| 2024/0154596 | A1 * | 5/2024 | Daimon | H03H 9/132 |
| 2024/0213949 | A1 * | 6/2024 | Daimon | H03H 9/02157 |
| 2024/0364294 | A1 * | 10/2024 | Daimon | H03H 9/562 |
| 2025/0080078 | A1 * | 3/2025 | Inoue | H03H 9/25 |
| 2025/0183876 | A1 * | 6/2025 | Nagatomo | H03H 9/562 |
| 2025/0274096 | A1 * | 8/2025 | Nakamura | H03H 9/568 |
| 2026/0095148 | A1 * | 4/2026 | Ishii | H03H 9/54 |

FOREIGN PATENT DOCUMENTS

| | | | |
|---|---|---|---|
| WO | 2012073871 | A1 | 6/2012 |
| WO | 2016147687 | A1 | 9/2016 |
| WO | 2018123775 | A1 | 7/2018 |

OTHER PUBLICATIONS

Written Opinion in PCT/JP2022/016188, mailed Jun. 14, 2022, 3 pages.

* cited by examiner

ACOUSTIC WAVE DEVICE

CROSS REFERENCE TO RELATED APPLICATIONS

This application claims the benefit of priority to Provisional Application No. 63/168,314 filed on Mar. 31, 2021 and is a Continuation Application of PCT Application No. PCT/JP2022/016188 filed on Mar. 30, 2022. The entire contents of each application are hereby incorporated herein by reference.

BACKGROUND OF THE INVENTION

1. Field of the Invention

The present invention relates to an acoustic wave device.

2. Description of the Related Art

In the related art, acoustic wave devices have been widely used for filters of mobile phones and the like. For example, Japanese Unexamined Patent Application Publication No. 2012-257019 discloses an acoustic wave device in which a Lamb wave as a plate wave is used. In this acoustic wave device, a piezoelectric substrate is provided on a support. The piezoelectric substrate is made of $LiNbO_3$ or $LiTaO_3$. An interdigital transducer (IDT) electrode is provided on an upper surface of the piezoelectric substrate. A voltage is applied between a plurality of electrode fingers connected to one potential of the IDT electrode and a plurality of electrode fingers connected to the other potential. This excites a Lamb wave. A reflector is provided on either side of the IDT electrode. Thus, an acoustic wave resonator is formed in which a Lamb wave is used.

SUMMARY OF THE INVENTION

In the acoustic wave device described in Japanese Unexamined Patent Application Publication No. 2012-257019, an unnecessary wave propagating on a surface of the piezoelectric substrate may occur. Electrical characteristics of the acoustic wave device may be deteriorated due to influence of the unnecessary wave.

Preferred embodiments of the present invention provide acoustic wave devices in each of which deterioration of electrical characteristics due to an unnecessary wave can be reduced or prevented.

An acoustic wave device according to a preferred embodiment of the present invention includes a piezoelectric substrate including a support and a piezoelectric layer, the support including a support substrate, the piezoelectric layer being provided on the support and including a first main surface and a second main surface opposed to each other, one or more functional electrodes provided on the first main surface or the second main surface of the piezoelectric layer, and including at least one pair of electrodes, a first support provided on the piezoelectric substrate so as to surround the functional electrodes, one or more second supports provided on the piezoelectric substrate, and located on a portion surrounded by the first support, and a cover provided on the first support and the second supports, wherein a direction in which the electrodes adjacent to each other face each other is an electrode facing direction, and a region in which the electrodes adjacent to each other overlap each other when viewed from the electrode facing direction is an intersecting region, and a direction in which the at least one pair of electrodes extend is an electrode extending direction, and the second supports at least partially overlap the intersecting region when viewed from the electrode extending direction.

According to preferred embodiments of the present invention, it is possible to provide acoustic wave devices in each of which, deterioration of electrical characteristics due to an unnecessary wave can be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings to clarify the present invention.

Note that the preferred embodiments described in the present specification are merely examples, and partial replacement or combination of configurations is possible between different preferred embodiments.

Figure 1:
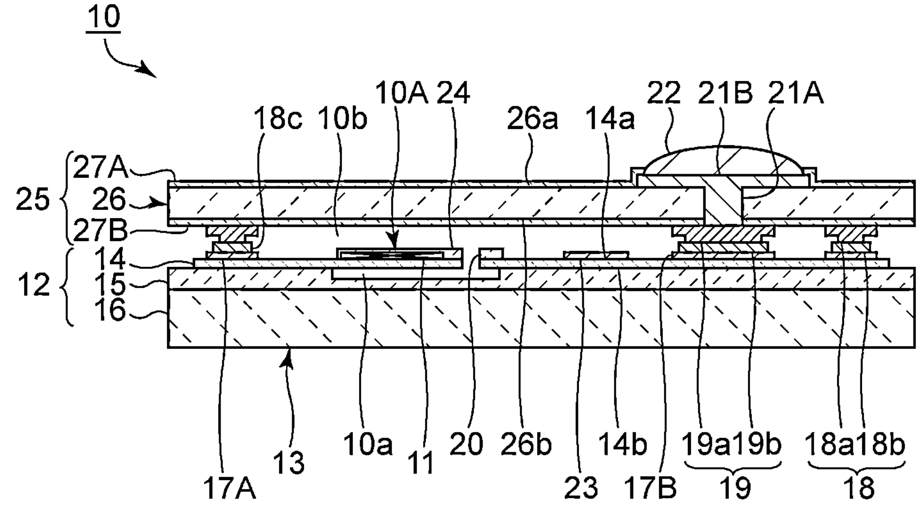
FIG. 1 is a schematic front sectional view of an acoustic wave device according to a first preferred embodiment of the present invention.
Figure 2:
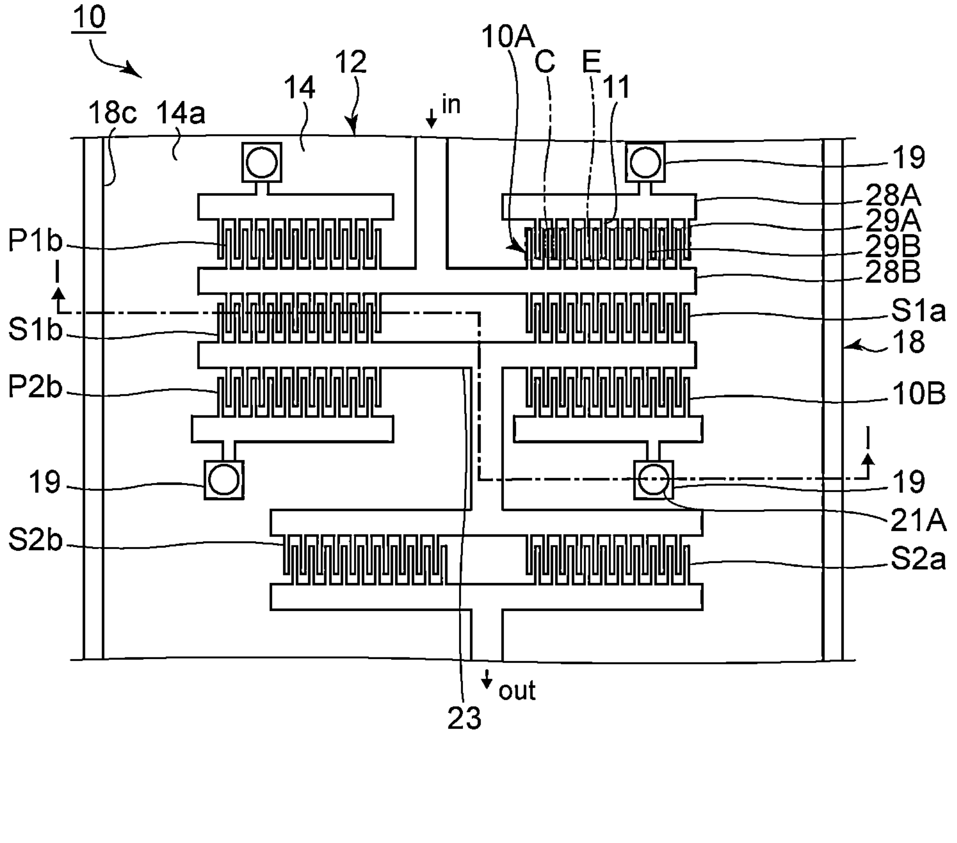
FIG. 2 is a schematic plan view of the acoustic wave device according to the first preferred embodiment of the present invention.

FIG. 1 is a schematic front sectional view of an acoustic wave device according to a first preferred embodiment of the present invention. FIG. 2 is a schematic plan view of the acoustic wave device according to the first preferred embodiment. In FIG. 1, an IDT electrode to be described later is illustrated by a schematic diagram in which two diagonal lines are added to a rectangle. In FIG. 2, a dielectric film to be described later is omitted. Note that FIG. 1 is a sectional view schematically illustrating a portion taken along line I-I in FIG. 2.

As illustrated in FIG. 1, an acoustic wave device 10 includes a piezoelectric substrate 12 and an IDT electrode 11 as a functional electrode. The piezoelectric substrate 12 includes a support member 13 and a piezoelectric layer 14. In the present preferred embodiment, the support member 13 includes a support substrate 16 and an intermediate layer 15. The intermediate layer 15 is provided on the support substrate 16. The piezoelectric layer 14 is provided on the intermediate layer 15. However, the support member 13 may include only the support substrate 16.

As a material of the support substrate 16, for example, a semiconductor such as silicon, ceramics such as aluminum oxide, or the like can be used. As a material of the intermediate layer 15, an appropriate dielectric such as silicon oxide or tantalum pentoxide can be used. The piezoelectric layer 14 is, for example, a lithium tantalate layer such as a $LiTaO_3$ layer or a lithium niobate layer such as a $LiNbO_3$ layer.

The piezoelectric layer 14 includes a first main surface 14*a* and a second main surface 14*b*. The first main surface 14*a* and the second main surface 14*b* are opposed to each other. Of the first main surface 14*a* and the second main surface 14*b*, the second main surface 14*b* is located close to the support member 13.

The support member 13 is provided with a first cavity portion 10*a*. More specifically, the intermediate layer 15 is provided with a recess. The piezoelectric layer 14 is provided on the intermediate layer 15 so as to close the recess. Thus, the first cavity portion 10*a* is formed. Note that the first cavity portion 10*a* may be provided in the intermediate layer 15 and the support substrate 16, or may be provided only in the support substrate 16. It is sufficient that the support member 13 is provided with at least one first cavity portion 10*a*.

As illustrated in FIG. 2, a plurality of IDT electrodes 11 is provided on the first main surface 14*a* of the piezoelectric layer 14. Thus, a plurality of acoustic wave resonators is formed. The plurality of acoustic wave resonators includes a first resonator 10A and a second resonator 10B. The acoustic wave device 10 in the present preferred embodiment is a filter device. Note that it is sufficient that the acoustic wave device 10 includes at least one IDT electrode 11. It is sufficient that an acoustic wave device according to a preferred embodiment of the present invention includes at least one acoustic wave resonator.

Referring back to FIG. 1, the IDT electrode 11 at least partially overlaps the first cavity portion 10*a* in plan view. To be more specific, in plan view, the IDT electrodes 11 of acoustic wave resonators may overlap different first cavity portions 10*a* or may overlap the same first cavity portion 10*a*. In the present specification, "in plan view" refers to a view from a direction corresponding to an upper side in FIG. 1. Further, "in plan view" refers to a view in a direction in which a first support 18 and a cover portion 25 that are described later are laminated. Note that in FIG. 1, for example, of the support substrate 16 and the piezoelectric layer 14, the piezoelectric layer 14 is on the upper side.

As illustrated in FIG. 2, the IDT electrode 11 has a first busbar 28A, a second busbar 28B, a plurality of first electrode fingers 29A and a plurality of second electrode fingers 29B. The first busbar 28A and the second busbar 28B face each other. One end of each of the plurality of first electrode fingers 29A is connected to the first busbar 28A. One end of each of the plurality of second electrode fingers 29B is connected to the second busbar 28B. The plurality of first electrode fingers 29A and the plurality of second electrode fingers 29B are interdigitated with each other. The first electrode finger 29A and the second electrode finger 29B correspond to electrodes in preferred embodiments of the present invention. The IDT electrode 11 may include a single-layer metal film or a multilayer metal film.

Hereinafter, a direction in which the first electrode finger 29A and the second electrode finger 29B adjacent to each other face each other is referred to as an electrode facing direction. A direction in which the plurality of first electrode fingers 29A and the plurality of second electrode fingers 29B extend is referred to as an electrode extending direction. In the present preferred embodiment, the electrode facing direction and the electrode extending direction are orthogonal to each other. When viewed from the electrode facing direction, a region in which the first electrode finger 29A and the second electrode finger 29B adjacent to each other overlap each other is an intersecting region E.

The first support 18 and a plurality of second supports 19 are provided on the first main surface 14*a* of the piezoelectric layer 14. In the present preferred embodiment, each of the first support 18 and the second support 19 is a laminate of a plurality of metal layers. The first support 18 has a frame-like shape. On the other hand, the second support 19 has a column-like shape. The first support 18 is provided so as to surround the plurality of IDT electrodes 11 and the plurality of second supports 19. More particularly, the first support 18 has a cavity 18*c*. The plurality of IDT electrodes 11 and the plurality of second supports 19 are located inside the cavity 18*c*.

Figure 3:
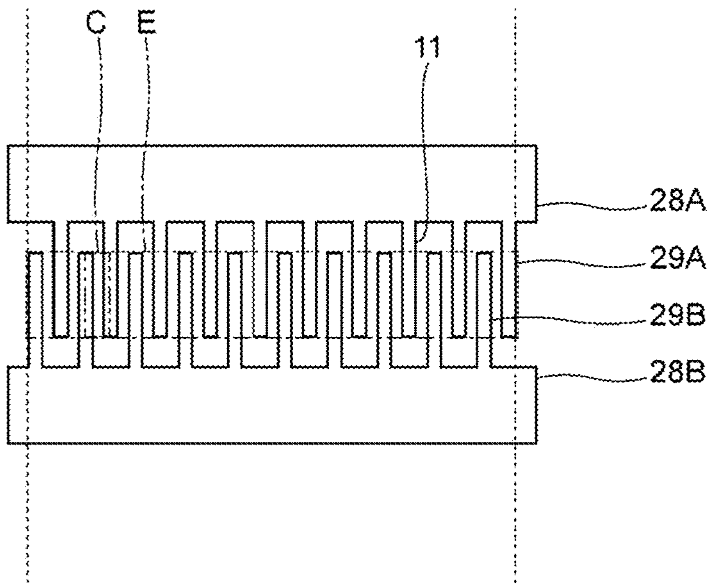
FIG. 3 is a schematic plan view illustrating a position overlapping an intersecting region when viewed from an electrode extending direction.

One second support 19, of the plurality of second supports 19, is disposed on an extension line of the first resonator 10A in the electrode extending direction. To be more specific, the second support 19 overlaps the intersecting region E of the first resonator 10A when viewed from the electrode extending direction. Another second support 19 overlaps the intersecting region E of the second resonator 10B when viewed from the electrode extending direction. In the present preferred embodiment, a position overlapping the intersecting region E when viewed from the electrode extending direction is the same as a position overlapping a portion where the first electrode finger 29A or the second electrode finger 29B is provided, when viewed from the electrode extending direction. For example, a position sandwiched between broken lines in FIG. 3 is the position overlapping the intersecting region E when viewed from the electrode extending direction.

As illustrated in FIG. 1, a frame-like electrode layer 17A is provided between the piezoelectric layer 14 and the first support 18. The electrode layer 17A, similarly to the first support 18, surrounds the plurality of IDT electrodes 11 and the plurality of second supports 19 in plan view. However, the electrode layer 17A need not be provided. The cover portion 25 is provided on the first support 18 and the plurality of second supports 19 so as to close the cavity 18*c*. Thus, a second cavity portion 10*b* surrounded by the piezoelectric substrate 12, the electrode layer 17A, the first support 18 and the cover portion 25 is provided. The plurality of IDT electrodes 11 and the plurality of second supports 19 are disposed inside the second cavity portion 10*b*.

As illustrated in FIG. 2, the present preferred embodiment has a feature in which the second support 19 is disposed so as to at least partially overlap the intersecting region E of the IDT electrode 11 when viewed from the electrode extending direction. Accordingly, it is possible to reduce or prevent deterioration of electrical characteristics due to an unnecessary wave. This will be explained below. Note that, in the following, the first busbar 28A and the second busbar 28B may each be simply described as a busbar. Similarly, the first electrode finger 29A and the second electrode finger 29B may each be simply described as an electrode finger.

The IDT electrode 11 includes a plurality of excitation regions C. By applying an AC voltage to the IDT electrode 11, acoustic waves are excited in the plurality of excitation regions C. In the present preferred embodiment, each acoustic wave resonator is configured such that a bulk wave in a thickness shear mode such as a thickness shear primary mode can be used. Similarly to the intersecting region E, the excitation region C is a region in which adjacent electrode fingers overlap each other when viewed from the electrode facing direction. Note that each excitation region C is a region between a pair of electrode fingers. More specifically, the excitation region C is a region from a center of one electrode finger in the electrode facing direction to a center of another electrode finger in the electrode facing direction. Thus, the intersecting region E includes the plurality of excitation regions C.

In an acoustic wave resonator, a main mode may be excited and an unnecessary wave may be excited. The unnecessary wave includes a wave propagating on a surface of a piezoelectric substrate.

On the other hand, in the present preferred embodiment, the second support 19 is provided on an extension line of the intersecting region E in the electrode extending direction. Thus, an unnecessary wave propagating on a surface of the piezoelectric substrate 12 collides with the second support 19. Accordingly, it is possible to scatter the unnecessary wave and to reduce or prevent deterioration of electrical characteristics of the acoustic wave device 10. Note that it is sufficient that the second support 19 is disposed so as to at least partially overlap the intersecting region E for any one acoustic wave resonator when viewed from the electrode extending direction.

In the following, further details of the configuration of the present preferred embodiment will be described.

As illustrated in FIG. 1, a dielectric film 24 is provided on the piezoelectric substrate 12 so as to cover the IDT electrode 11. Thus, the IDT electrode 11 is less likely to be damaged. For the dielectric film 24, for example, silicon oxide, silicon nitride, silicon oxynitride, or the like may be used. When the dielectric film 24 is made of silicon oxide, frequency-temperature characteristics can be improved. On the other hand, when the dielectric film 24 is made of silicon nitride or the like, the dielectric film 24 can be used as a frequency adjustment film. Note that the dielectric film 24 need not be provided.

A through-hole 20 is continuously provided from the piezoelectric layer 14 to the dielectric film 24. The through-hole 20 is provided so as to reach the first cavity portion 10*a*. The through-hole 20 is used to remove a sacrificial layer in the intermediate layer 15 when the acoustic wave device 10 is manufactured. However, the through-hole 20 need not necessarily be provided.

The cover portion 25 includes a cover body 26, an insulating body layer 27A and an insulating body layer 27B. The cover body 26 includes a first main surface 26*a* and a second main surface 26*b*. The first main surface 26*a* and the second main surface 26*b* are opposed to each other. Of the first main surface 26*a* and the second main surface 26*b*, the second main surface 26*b* is located close to the piezoelectric substrate 12. The insulating body layer 27A is provided on the first main surface 26*a*. The insulating body layer 27B is provided on the second main surface 26*b*. In the present preferred embodiment, a main component of the cover body 26 is silicon. The material of the cover body 26 is not limited to the above, but a semiconductor such as silicon is preferably used as the main component. In the present specification, the main component refers to a component that accounts for more than about 50% by weight, for example. On the other hand, the insulating body layer 27A and the insulating body layer 27B are, for example, silicon-oxide layers.

The cover portion 25 is provided with an under bump metal 21A. More specifically, a through-hole is provided in the cover portion 25. The through-hole is provided so as to reach the second support 19. The under bump metal 21A is provided in the through-hole. One end of the under bump metal 21A is connected to the second support 19. An electrode pad 21B is provided so as to be connected to the other end of the under bump metal 21A. Note that in the present preferred embodiment, the under bump metal 21A and the electrode pad 21B are integrally provided. However, the under bump metal 21A and the electrode pad 21B may be provided as separate bodies. A bump 22 is bonded to the electrode pad 21B.

More specifically, the insulating body layer 27A is provided so as to cover a vicinity of an outer peripheral edge of the electrode pad 21B. The bump 22 is bonded to a portion of the electrode pad 21B that is not covered with the insulating body layer 27A. Note that the insulating body layer 27A may reach an interval between the electrode pad 21B and the cover body 26. Furthermore, the insulating body layer 27A may reach an interval between the under bump metal 21A and the cover body 26. The insulating body layer 27A and the insulating body layer 27B may be integrally through a through-hole of the cover body 26.

As described above, in the present preferred embodiment, each of the first support 18 and the second support 19 is a laminate of a plurality of metal layers. To be more specific, the first support 18 includes a first portion 18*a* and a second portion 18*b*. Of the first portion 18*a* and the second portion 18*b*, the first portion 18*a* is located close to the cover portion 25, and the second portion 18*b* is located close to the piezoelectric substrate 12. Similarly, the second support 19 also includes a first portion 19*a* and a second portion 19*b*. Of the first portion 19*a* and the second portion 19*b*, the first portion 19*a* is located close to the cover portion 25, and the second portion 19*b* is located close to the piezoelectric substrate 12. Each of the first portion 18*a* and the first portion 19*a* is made of Au or the like, for example. Each of the second portion 18*b* and the second portion 19*b* is made of Al or the like, for example. In the present specification, a case where a certain member is made of a certain material includes a case where a trace amount of impurities is included to such an extent that electrical characteristics of an acoustic wave device are not deteriorated.

As illustrated in FIG. 2, in the present preferred embodiment, acoustic wave resonators adjacent to each other in the electrode extending direction share a busbar. The shared busbar is a first busbar in one acoustic wave resonator, and is a second busbar in the other acoustic wave resonator.

A plurality of wiring electrodes 23 is provided on the piezoelectric substrate 12. Some wiring electrodes of the plurality of wiring electrodes 23 connect the IDT electrodes 11 to each other. Some other wiring electrodes of the plurality of wiring electrodes 23 electrically connect the IDT electrode 11 and the second support 19. More specifically, as illustrated in FIG. 1, a conductive film 17B is provided on the piezoelectric substrate 12. The second support 19 is provided over the conductive film 17B. Thus, the wiring electrode 23 is electrically connected to the second support 19 with the conductive film 17B interposed therebetween. Then, the plurality of IDT electrodes 11 is electrically connected to an external component with the wiring electrode 23, the conductive film 17B, the second support 19, the under bump metal 21A, the electrode pad 21B and the bump 22 interposed therebetween.

As illustrated in FIG. 2, it is sufficient that the second support 19 is disposed so as to overlap the intersecting region E for at least one acoustic wave resonator when viewed from the electrode extending direction. When viewed from the electrode extending direction, the second support 19 is preferably provided so as to overlap the intersecting region E of an acoustic wave resonator for which a distance from the second support 19 is the shortest. Accordingly, it is possible to effectively scatter an unnecessary wave.

The plurality of second supports 19 may include the second support 19 not connected to the under bump metal 21A. It is sufficient that the second support 19 is disposed so as to at least partially overlap the intersecting region E of the IDT electrode 11 when viewed from the electrode extending direction, regardless of whether or not the second support 19 is connected to the under bump metal 21A. Thus, it is possible to scatter an unnecessary wave.

The functional electrode in the present preferred embodiment is the IDT electrode 11. Note that the functional electrode only needs to have at least one pair of electrode fingers. In this case, a bulk wave in a thickness shear mode can be used.

On the other hand, the plurality of acoustic wave resonators of the acoustic wave device 10 may be configured such that a plate wave can be used, for example. When a plate wave is used in each acoustic wave resonator, the intersecting region E of the IDT electrode 11 is an excitation region. In this case, as a material of the piezoelectric layer 14, for example, lithium niobate, lithium tantalate, zinc oxide, aluminum nitride, quartz crystal, lead zirconate titanate (PZT), or the like can be used.

Incidentally, a circuit configuration in the present preferred embodiment is as follows.

Figure 4:
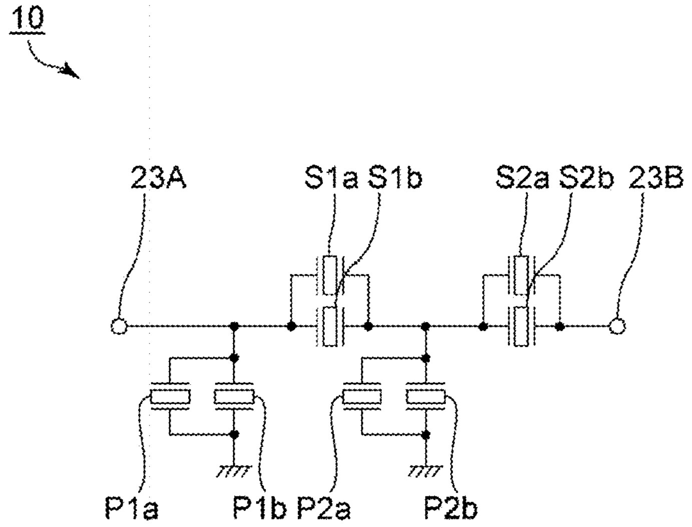
FIG. 4 is a circuit diagram of the acoustic wave device according to the first preferred embodiment of the present invention.

FIG. 4 is a circuit diagram of the acoustic wave device according to the first preferred embodiment.

As illustrated in FIG. 4, the acoustic wave device 10 is a ladder filter. The acoustic wave device 10 includes an input terminal 23A, an output terminal 23B, a plurality of series arm resonators and a plurality of parallel arm resonators. The input terminal 23A and the output terminal 23B may be configured as electrode pads or may be configured as wiring lines, for example. In the acoustic wave device 10, a signal is inputted from the input terminal 23A.

Each resonator of the plurality of series arm resonators and the plurality of parallel arm resonators of the acoustic wave device 10 is a split-type acoustic wave resonator. The plurality of series arm resonators is, specifically, a series arm resonator S1a, a series arm resonator Sib, a series arm resonator S2a and a series arm resonator S2b. The series arm resonator S1a and the series arm resonator S1b are resonators obtained by dividing one series arm resonator into parallel resonators. Similarly, the series arm resonator S2a and the series arm resonator S2b are resonators obtained by dividing one series arm resonator into parallel resonators. The series arm resonator S1a and the series arm resonator S1b, and the series arm resonator S2a and the series arm resonator S2b are connected in series with each other between the input terminal 23A and the output terminal 23B.

The plurality of parallel arm resonators is, specifically, a parallel arm resonator P1a, a parallel arm resonator P1b, a parallel arm resonator P2a and a parallel arm resonator P2b. The parallel arm resonator P1a and the parallel arm resonator P1b are resonators obtained by dividing one parallel arm resonator into parallel resonators. Similarly, the parallel arm resonator P2a and the parallel arm resonator P2b are resonators obtained by dividing one parallel arm resonator into parallel resonators. The parallel arm resonator P1a and the parallel arm resonator P1b are connected in parallel with each other between the input terminal 23A and the ground potential. The parallel arm resonator P2a and the parallel arm resonator P2b are connected in parallel with each other between the ground potential and a connection point between the series arm resonator S1a and the series arm resonator S2a.

The parallel arm resonator P1a is the first resonator 10A illustrated in FIG. 2. The parallel arm resonator P2a is the second resonator 10B illustrated in FIG. 2.

Note that the circuit configuration of the acoustic wave device 10 is not limited to the above. The series arm resonators and the parallel arm resonators may be resonators obtained by dividing into series resonators. Alternatively, the series arm resonators and the parallel arm resonators need not be split-type resonators. When the acoustic wave device 10 is a ladder filter, it is sufficient that a plurality of resonators includes at least one series arm resonator and at least one parallel arm resonator.

As illustrated in FIG. 2, each parallel arm resonator of the plurality of parallel arm resonators is connected to the second support 19. In the present preferred embodiment, the plurality of parallel arm resonators is connected to the ground potential with the second supports 19 interposed therebetween. Note that such a configuration in which at least one second support 19 is electrically connected to the IDT electrode 11 of the acoustic wave resonator can improve heat dissipation properties.

Preferred configurations in the present preferred embodiment will be described below.

As illustrated in FIG. 2, the second resonator 10B serving as the parallel arm resonator P2a and the series arm resonator S2a are adjacent to each other in the electrode extending direction. It is preferable that the second support 19 be disposed between the adjacent acoustic wave resonators as described above. Thus, heat generated in the IDT electrode 11 of each acoustic wave resonator can be dissipated outside through the second support 19. Thus, it is possible to effectively enhance heat dissipation properties. In addition, an unnecessary wave generated in each acoustic wave resonator is less likely to reach an adjacent acoustic wave resonator. Note that the second support 19 may be disposed between acoustic wave resonators in the electrode facing direction.

On the other hand, at least one second support 19 is preferably provided between an acoustic wave resonator and the first support 18, and is preferably not provided between acoustic wave resonators of a plurality of acoustic wave resonators. In this case, an unnecessary wave leaking from the acoustic wave resonator can be effectively scattered by the second support 19.

The above-described conductive film 17B and wiring electrode 23 are preferably made of the same material. When the wiring electrode 23 is connected to the conductive film 17B, the conductive film 17B and the wiring electrode 23 are preferably integrally provided. Accordingly, productivity can be enhanced. Note that the conductive film 17B need not be necessarily connected to the wiring electrode 23.

The wiring electrode 23 is preferably provided between the second support 19 and at least one acoustic wave resonator. In this case, heat dissipation properties can be enhanced.

Referring back to FIG. 1, when a dimension along a direction in which the piezoelectric substrate 12, the first support 18 and the cover portion 25 are laminated is defined as a height, it is preferable that a height of the second cavity portion 10*b* be greater than a height of the first cavity portion 10*a*. In this case, even when the piezoelectric layer 14 is deformed in a protruding shape from the first cavity portion 10*a* side toward the second cavity portion 10*b* side, the piezoelectric layer 14 is less likely to adhere to the cover portion 25.

Figure 5:
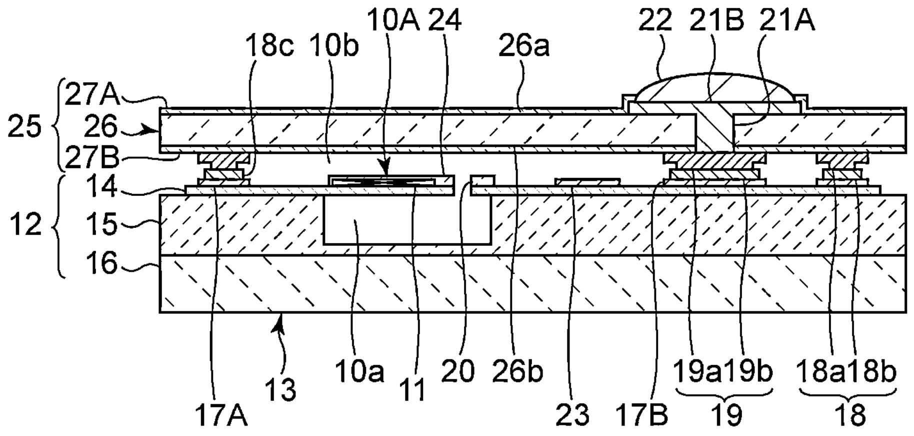
FIG. 5 is a schematic front sectional view of an acoustic wave device according to a modification of the first preferred embodiment of the present invention.

However, the height relationship between the first cavity portion 10*a* and the second cavity portion 10*b* is not limited to the above. In a modification of the first preferred embodiment illustrated in FIG. 5, a height of the first cavity portion 10*a* is greater than a height of the second cavity portion 10*b*. In this case, even when the piezoelectric layer 14 is deformed in a protruding shape from the second cavity portion 10*b* side toward the first cavity portion 10*a* side, the piezoelectric layer 14 is less likely to adhere to the support member 13. In addition, as in the first preferred embodiment, it is possible to scatter an unnecessary wave and to reduce or prevent deterioration of electrical characteristics due to the unnecessary wave.

Incidentally, in the first preferred embodiment, the first support 18 and the plurality of second supports 19 are provided on the piezoelectric layer 14 in the piezoelectric substrate 12. However, the first support 18 may be at least partially provided on a portion of the piezoelectric substrate 12 where the piezoelectric layer 14 is not provided. Similarly, the second support 19 may be at least partially provided on a portion of the piezoelectric substrate 12 where the piezoelectric layer 14 is not provided. For example, the first support 18 or the second support 19 may be at least partially provided on the intermediate layer 15 or the support substrate 16.

In the first preferred embodiment, the first support 18 and the plurality of second supports 19 are each a laminate of metal layers. Note that the first portion 18*a* of the first support 18 and the first portion 19*a* of the second support 19 may be made of resin. Also in this case, since the second portion 19*b* of the second support 19 includes metal, it is possible to scatter an unnecessary wave. Thus, it is possible to reduce or prevent deterioration of electrical characteristics due to the unnecessary wave. When the first portion 19*a* of the second support 19 is made of resin, it is sufficient that the under bump metal 21A is provided so as to penetrate through the first portion 19*a*.

The cover body 26 includes a semiconductor as a main component. Note that the cover portion 25 may be made of resin. Further, when the first portion 18*a* of the first support 18 and the first portion 19*a* of the second support 19 are made of resin, it is preferable that the first portion 18*a*, the first portion 19*a* and the cover portion 25 be integrally formed of the same resin material. Accordingly, productivity can be enhanced.

In the first preferred embodiment, the IDT electrode 11 is provided on the first main surface 14*a* of the piezoelectric layer 14. However, the IDT electrode 11 may be provided on the second main surface 14*b* of the piezoelectric layer 14. In this case, the IDT electrode 11 is located, for example, in the first cavity portion 10*a*.

As described above, it is sufficient that the second support 19 is disposed so as to at least partially overlap the intersecting region E of the IDT electrode 11 when viewed from the electrode extending direction. For example, in the first preferred embodiment, as illustrated in FIG. 2, a portion of the second support 19 connected to the parallel arm resonator P2b overlaps the intersecting region E of the parallel arm resonator P2b in the electrode extending direction. Another portion of the second support 19 does not overlap the intersecting region E in the electrode extending direction.

Figure 6:
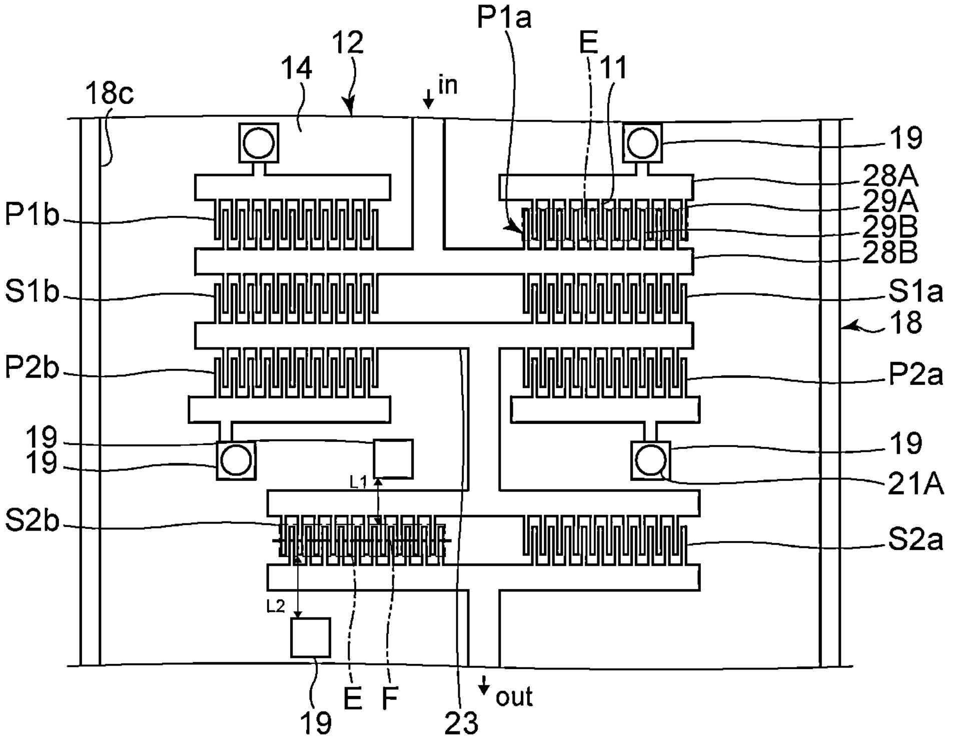
FIG. 6 is a schematic plan view of an acoustic wave device according to a second preferred embodiment of the present invention.

FIG. 6 is a schematic plan view of an acoustic wave device according to a second preferred embodiment.

The present preferred embodiment differs from the first preferred embodiment in a disposition of a plurality of second supports 19. Except for the above points, an acoustic wave device of the present preferred embodiment has a similar configuration to that of the acoustic wave device 10 of the first preferred embodiment.

As illustrated in FIG. 6, also in the present preferred embodiment, the second support 19 is disposed so as to at least partially overlap the intersecting region E of the IDT electrode 11 when viewed from the electrode extending direction. Thus, as in the first preferred embodiment, it is possible to scatter an unnecessary wave and to reduce or prevent deterioration of electrical characteristics due to the unnecessary wave.

In the present preferred embodiment, a pair of second supports 19 are disposed so as to sandwich the series arm resonator S2b. This makes it possible to effectively enhance the heat dissipation properties. It is preferable that each of both the second supports 19 be disposed so as to at least partially overlap the intersecting region E of the series arm resonator S2b when viewed from the electrode extending direction. Accordingly, it is possible to effectively scatter an unnecessary wave.

However, the number of pairs of second supports 19 disposed so as to sandwich the series arm resonator S2b is not limited to one, and may be two or more. Alternatively, the number of pairs of second supports 19 may be 1.5 or the like. A state where the series arm resonator S2b is sandwiched between the 1.5 pairs of second supports 19 means that two second supports 19 are disposed on one side in the electrode extending direction and one second support 19 is disposed on the other side in the electrode extending direction, and thus the acoustic wave resonator is sandwiched.

In the present preferred embodiment, the second supports 19 sandwiching the series arm resonator S2b are asymmetrically disposed. The above term "asymmetrically" means that when an axis passing through a center of the intersecting region E in the electrode extending direction and extending in the electrode facing direction is a symmetric axis F in plan view, the disposition of the plurality of second supports 19 is not line-symmetrical.

Specifically, in the present preferred embodiment, the second support 19 on one side is disposed close to an end on the one side of the intersecting region E in the electrode facing direction with respect to a center of the intersecting region E in the electrode facing direction. The second support 19 on the other side is disposed close to an end on the other side of the intersecting region E with respect to the above center. In this way, the disposition is asymmetric in the electrode facing direction.

In addition, in the present preferred embodiment, the disposition is asymmetric also in the electrode extending direction. To be more specific, a distance L1 is defined as a distance between the second support 19 on one side of the second supports 19 sandwiching the series arm resonator S2b, and an end on the one side in the electrode extending direction of the intersecting region E in the series arm resonator S2b. A distance L2 is defined as a distance between the second support 19 on the other side and an end on the other side of the above intersecting region E. As illustrated in FIG. 6, L1≠L2.

In other words, in the present preferred embodiment, the pair of second supports 19 sandwiching the series arm resonator S2b are disposed asymmetrically in both the electrode facing direction and the electrode extending direction. Note that when the above pair of second supports 19 are asymmetrically disposed, it is sufficient that the disposition is asymmetric in at least one of the electrode facing direction and the electrode extending direction. Accordingly, it is possible to effectively scatter an unnecessary wave.

However, as in the present preferred embodiment, preferably L1≠L2. Accordingly, phases of unnecessary waves when the unnecessary waves reach the respective second supports 19 can be shifted from each other. Thus, it is possible to further scatter an unnecessary wave.

Respective centers of the pair of second supports 19 are preferably asymmetrically disposed in at least one of the electrode facing direction and the electrode extending direction. In this case, an unnecessary wave can be scattered more reliably and effectively.

As described above, by disposing the second supports 19 so as to sandwich the series arm resonator S2b, heat dissipation properties can be effectively improved. In the present preferred embodiment, the pair of second supports 19 sandwich the series arm resonator S2b in a direction intersecting both the electrode facing direction and the electrode extending direction. However, the direction in which the acoustic wave resonator is sandwiched by the plurality of second supports 19 is not limited to the above. For example, the plurality of second supports 19 may sandwich the acoustic wave resonator in the electrode facing direction or may sandwich the acoustic wave resonator in the electrode extending direction.

Figure 7:
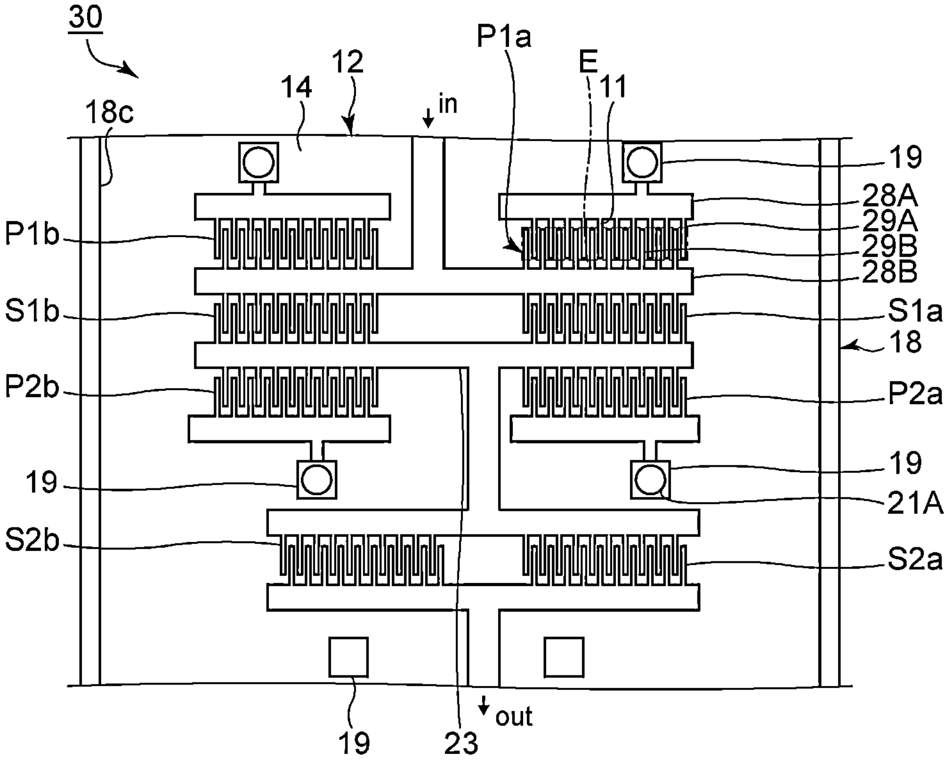
FIG. 7 is a schematic plan view of an acoustic wave device according to a third preferred embodiment of the present invention.

FIG. 7 is a schematic plan view of an acoustic wave device according to a third preferred embodiment.

The present preferred embodiment is different from the second preferred embodiment in a disposition of a plurality of second supports 19. Except for the above-described points, an acoustic wave device 30 of the present preferred embodiment has a similar configuration to that of the acoustic wave device of the second preferred embodiment.

As illustrated in FIG. 7, also in the present preferred embodiment, the second support 19 is disposed so as to at least partially overlap the intersecting region E of the IDT electrode 11 when viewed from the electrode extending direction. Thus, as in the second preferred embodiment, it is possible to scatter an unnecessary wave and to reduce or prevent deterioration of electrical characteristics due to the unnecessary wave.

In the acoustic wave device 30, a pair of second supports 19 are provided so as to sandwich the series arm resonator S2a in the electrode extending direction. Similarly, a pair of second supports 19 are provided so as to sandwich the series arm resonator S2b in the electrode extending direction. Thus, heat generated in the series arm resonator S2a and the series arm resonator S2b can be effectively dissipated.

On the other hand, the second support 19 is provided on one side in the electrode extending direction of the parallel arm resonator P1a. Similarly, the second support 19 is provided on one side in the electrode extending direction of the parallel arm resonator P1b. Accordingly, it is possible to reduce portions where the second supports 19 are disposed, and to reduce an area of the piezoelectric substrate 12. Such a configuration is particularly suitable in a circuit configuration in which the series arm resonator S2a and the series arm resonator S2b are required to have higher electric power handling capability than the parallel arm resonator P1a and the parallel arm resonator P1b. Specifically, it is possible to increase electric power handling capability of the acoustic wave device 30 as a whole, and to reduce the acoustic wave device 30 in size.

Figure 8:
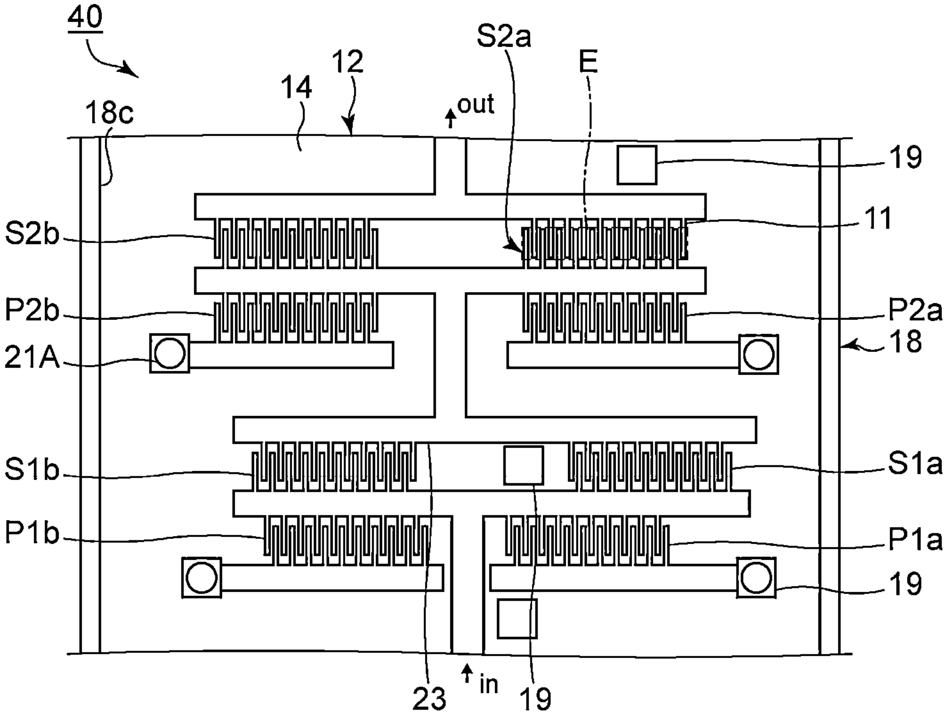
FIG. 8 is a schematic plan view of an acoustic wave device according to a fourth preferred embodiment of the present invention.

FIG. 8 is a schematic plan view of an acoustic wave device according to a fourth preferred embodiment. Note that FIG. 7 described above illustrates that a signal is inputted from above, but FIG. 8 illustrates that a signal is inputted from below.

The present preferred embodiment is different from the third preferred embodiment in a disposition of a plurality of acoustic wave resonators and a disposition of a plurality of second supports 19. Except for the above-described points, an acoustic wave device 40 of the present preferred embodiment has a similar configuration to that of the acoustic wave device 30 of the third preferred embodiment.

As illustrated in FIG. 8, also in the present preferred embodiment, the second support 19 is disposed so as to at least partially overlap the intersecting region E of the IDT electrode 11 when viewed from the electrode extending direction. Accordingly, as in the third preferred embodiment, it is possible to scatter an unnecessary wave and to reduce or prevent deterioration of electrical characteristics due to the unnecessary wave.

In the present preferred embodiment, a pair of second supports 19 are provided so as to sandwich the parallel arm resonator P1a in the electrode extending direction. Thus, heat generated in the parallel arm resonator P1a can be effectively dissipated. On the other hand, the second support 19 is provided on one side in the electrode extending direction of the series arm resonator S2a. Accordingly, it is possible to reduce portions where the second supports 19 are disposed, and to reduce an area of the piezoelectric substrate 12. Such a configuration is particularly suitable in a circuit configuration in which the parallel arm resonator P1a is required to have higher electric power handling capability than the series arm resonator S2a. Specifically, it is possible to increase electric power handling capability of the acoustic wave device 40 as a whole, and to reduce the acoustic wave device 40 in size.

Note that on the circuit, the parallel arm resonator P1a is one of acoustic wave resonators closest to the input terminal 23A of a plurality of acoustic wave resonators. In this case, the parallel arm resonator P1a is particularly likely to be required to have high electric power handling capability.

The second support 19 is provided between the series arm resonator S1a and the series arm resonator S1b. In this manner, the second support 19 is disposed between the split-type resonators. This makes it possible to effectively enhance the heat dissipation properties. Note that a plurality of second supports 19 may be provided between the series arm resonator S1a and the series arm resonator S1b.

Hereinafter, a thickness shear mode and a plate wave will be described in detail. Note that an electrode in the following example corresponds to the electrode finger described above. A support member in the following example corresponds to the support substrate in a preferred embodiment of the present invention.

Figure 9A:
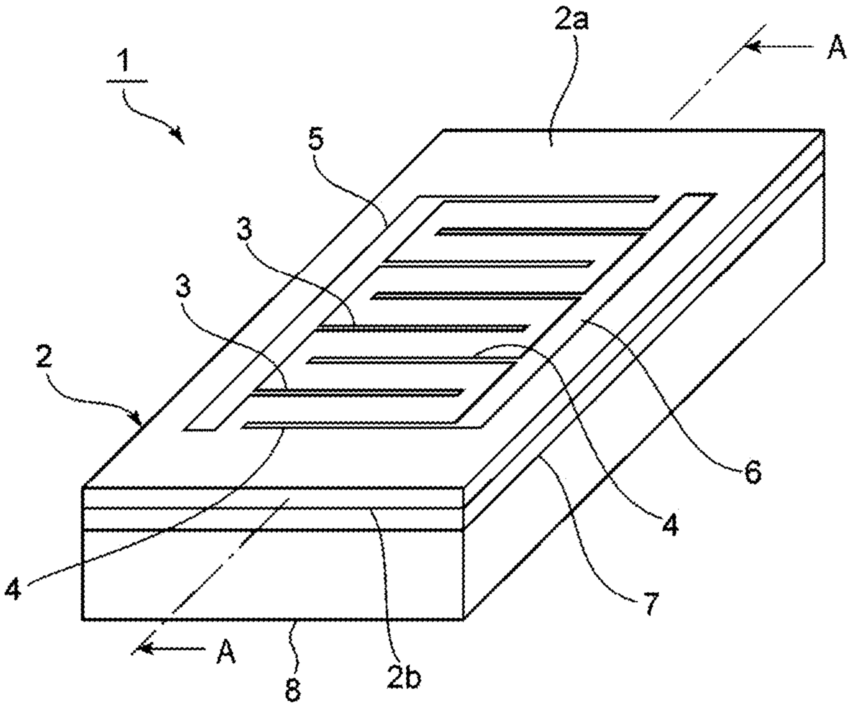
FIG. 9A is a schematic perspective view illustrating an appearance of an acoustic wave device in which a bulk wave in a thickness shear mode is used.
Figure 9B:
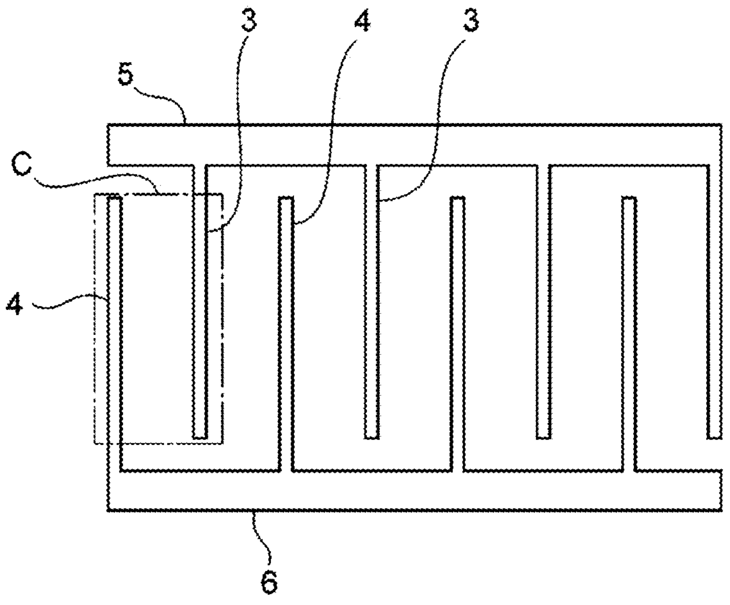
FIG. 9B is a plan view illustrating an electrode structure on a piezoelectric layer.
Figure 10:
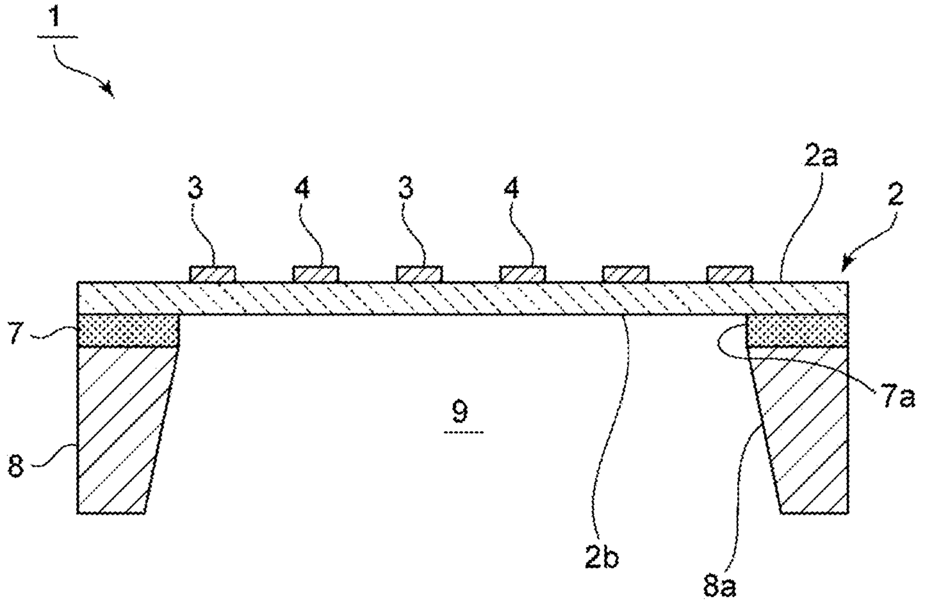
FIG. 10 is a sectional view of a portion taken along line A-A in FIG. 9A.

FIG. 9A is a schematic perspective view illustrating an appearance of an acoustic wave device in which a bulk wave in a thickness shear mode is used, FIG. 9B is a plan view illustrating an electrode structure on a piezoelectric layer, and FIG. 10 is a sectional view of a portion along line A-A in FIG. 9A.

The acoustic wave device 1 includes a piezoelectric layer 2 made of $LiNbO_3$. The piezoelectric layer 2 may be made of $LiTaO_3$. A cut angle of $LiNbO_3$ or $LiTaO_3$ is set to Z-cut, but may be set to rotated Y-cut or X-cut. In order to effectively excite the thickness shear mode, a thickness of the piezoelectric layer 2 is not particularly limited, but preferably equal to or greater than about 40 nm and equal to or less than about 1000 nm, and more preferably equal to or greater than about 50 nm and equal to or less than about 1000 nm, for example. The piezoelectric layer 2 includes first and second main surfaces 2*a* and 2*b* opposed to each other. An electrode 3 and an electrode 4 are provided on the first main surface 2*a*. Here, the electrode 3 is an example of a “first electrode finger”, and the electrode 4 is an example of a “second electrode finger”. In FIGS. 9A and 9B, a plurality of electrodes 3 is connected to a first busbar 5. A plurality of electrodes 4 is connected to a second busbar 6. The plurality of electrodes 3 and the plurality of electrodes 4 are interdigitated with each other. The electrode 3 and the electrode 4 each have a rectangular shape, and have a length direction. The electrode 3 and the electrode 4 adjacent thereto face each other in a direction orthogonal to the length direction. The length direction of the electrodes 3 and 4 and the direction orthogonal to the length direction of the electrodes 3 and 4 are both directions intersecting a thickness direction of the piezoelectric layer 2. Thus, it can also be said that the electrode 3 and the adjacent electrode 4 face each other in a direction intersecting the thickness direction of the piezoelectric layer 2. Further, the length direction of the electrodes 3 and 4 may be replaced with the direction orthogonal to the length direction of the electrodes 3 and 4 illustrated in FIGS. 9A and 9B. That is, in FIGS. 9A and 9B, the electrodes 3 and 4 may be extended in a direction in which the first busbar 5 and the second busbar 6 extend. In this case, the first busbar 5 and the second busbar 6 extend in the direction in which the electrodes 3 and 4 extend in FIGS. 9A and 9B. Then, a plurality of structures is disposed in the above direction orthogonal to the length direction of the electrodes 3 and 4, and in each structure, a pair of the electrode 3 connected to one potential and the electrode 4 connected to the other potential are adjacent to each other. Here, the case where the electrode 3 and the electrode 4 are adjacent to each other refers not to a case where the electrode 3 and the electrode 4 are disposed so as to be in direct contact with each other but to a case where the electrode 3 and the electrode 4 are disposed with an interval interposed therebetween. In addition, when the electrode 3 and the electrode 4 are adjacent to each other, an electrode connected to a hot electrode or a ground electrode, including another electrode 3 or 4, is not disposed between the electrode 3 and the electrode 4. The number of pairs need not be an integer, but may be 1.5, 2.5, or the like. A center-to-center distance between the electrodes 3 and 4, that is, a pitch preferably falls within a range from equal to or greater than about 1 μm to equal to or less than about 10 μm, for example. In addition, widths of the electrodes 3 and 4, that is, dimensions of the electrodes 3 and 4 in a facing direction preferably fall within a range from equal to or greater than about 50 nm to equal to or less than about 1000 nm, and more preferably falls within a range from equal to or greater than about 150 nm to equal to or less than about 1000 nm, for example. Note that the center-to-center distance between the electrodes 3 and 4 is a distance between a center of a dimension (width dimension) of the electrode 3 in the direction orthogonal to the length direction of the electrode 3 and a center of a dimension (width dimension) of the electrode 4 in the direction orthogonal to the length direction of the electrode 4.

Further, the Z-cut piezoelectric layer is used in the acoustic wave device 1, thus the direction orthogonal to the length direction of the electrodes 3 and 4 is a direction orthogonal to a polarization direction of the piezoelectric layer 2. This is not the case when a piezoelectric body having another cut angle is used as the piezoelectric layer 2. Here, “orthogonal” is not limited to strictly orthogonal but may be substantially orthogonal (an angle formed by the direction orthogonal to the length direction of the electrodes 3 and 4 and the polarization direction falls within a range of about 90°±10°, for example).

A support member 8 is laminated on the second main surface 2*b* side of the piezoelectric layer 2 with an insulating layer 7 interposed therebetween. The insulating layer 7 and the support member 8 each have a frame-like shape, and have through-holes 7*a* and 8*a*, respectively, as illustrated in FIG. 10. Thus, a cavity portion 9 is formed. The cavity portion 9 is provided so as not to interfere with vibrations of the excitation region C of the piezoelectric layer 2. Thus, the above support member 8 is laminated on the second main surface 2*b* with the insulating layer 7 interposed therebetween at a position not overlapping a portion where at least a pair of electrodes 3 and 4 are provided. Note that the insulating layer 7 need not be provided. Thus, the support member 8 may be directly or indirectly laminated on the second main surface 2*b* of the piezoelectric layer 2.

The insulating layer 7 is made of silicon oxide. However, in addition to silicon oxide, an appropriate insulating material such as silicon oxynitride or alumina may be used. The support member 8 is made of Si. A plane orientation of a surface of Si close to the piezoelectric layer 2 may be (100), (110) or (111). It is desirable that Si forming the support member 8 has a high resistance of a resistivity equal to or greater than about 4 kΩcm, for example. Of course, the support member 8 can also be formed using an appropriate insulating material or semiconductor material.

Examples of the material of the support member 8 include piezoelectric materials such as aluminum oxide, lithium tantalate, lithium niobate and quartz crystal, various ceramics such as alumina, magnesia, sapphire, silicon nitride, aluminum nitride, silicon carbide, zirconia, cordierite, mullite, steatite and forsterite, dielectrics such as diamond and glass, and semiconductors such as gallium nitride.

The plurality of electrodes 3 and 4 and the first and second busbars 5 and 6 described above are made of an appropriate metal or alloy such as Al or an AlCu alloy. In the present preferred embodiment, the electrodes 3 and 4 and the first and second busbars 5 and 6 each have a structure in which an Al film is laminated on a Ti film. Note that a close contact layer other than the Ti film may be used.

During driving, an AC voltage is applied between the plurality of electrodes 3 and the plurality of electrodes 4. More specifically, an AC voltage is applied between the first busbar 5 and the second busbar 6. This makes it possible to obtain resonance characteristics using a bulk wave in a thickness shear mode excited in the piezoelectric layer 2. In addition, in the acoustic wave device 1, d/p is set to equal to or less than about 0.5, for example, where a thickness of the piezoelectric layer 2 is d, and a center-to-center distance between any adjacent electrodes 3 and 4 of the plurality of pairs of electrodes 3 and 4 is p. Thus, the bulk wave in the thickness shear mode described above is effectively excited, and good resonance characteristics can be obtained. More preferably, d/p is equal to or less than about 0.24, for example, in which case even better resonance characteristics can be obtained.

Since the acoustic wave device 1 has the above-described configuration, even when the number of pairs of the electrodes 3 and 4 is reduced in order to achieve a reduction in size, a decrease in a Q factor is less likely to occur. This is because a propagation loss is small even when the number of electrode fingers in reflectors on both sides is reduced. Further, the reason why the number of electrode fingers can be reduced is that the bulk wave in the thickness shear mode is used. A difference between the Lamb wave used in the acoustic wave device and the bulk wave in the thickness shear mode described above will be described with reference to FIGS. 11A and 11B.

Figure 11A:
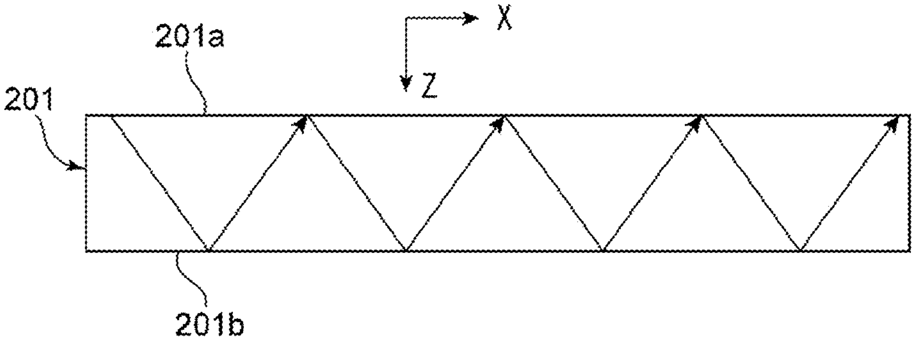
FIG. 11A is a schematic front sectional view for explaining a Lamb wave propagating through a piezoelectric film of an acoustic wave device.

FIG. 11A is a schematic front sectional view for explaining a Lamb wave propagating through a piezoelectric film of the acoustic wave device as described in Japanese Unexamined Patent Application Publication No. 2012-257019. Here, a wave propagates through a piezoelectric film 201 as indicated by arrows. Here, in the piezoelectric film 201, a first main surface 201*a* and a second main surface 201*b* are opposed to each other, and a thickness direction in which the first main surface 201*a* and the second main surface 201*b* are connected is a Z direction. An X direction is a direction in which electrode fingers of an IDT electrode are disposed. As illustrated in FIG. 11A, a Lamb wave propagates in the X direction as illustrated. Because of a plate wave, the piezoelectric film 201 vibrates as a whole, but the wave propagates in the X direction, thus reflectors are disposed on both sides to obtain resonance characteristics. Thus, a propagation loss of the wave occurs, and a Q factor decreases when a size is reduced, that is, when the number of pairs of electrode fingers is reduced.

Figure 11B:
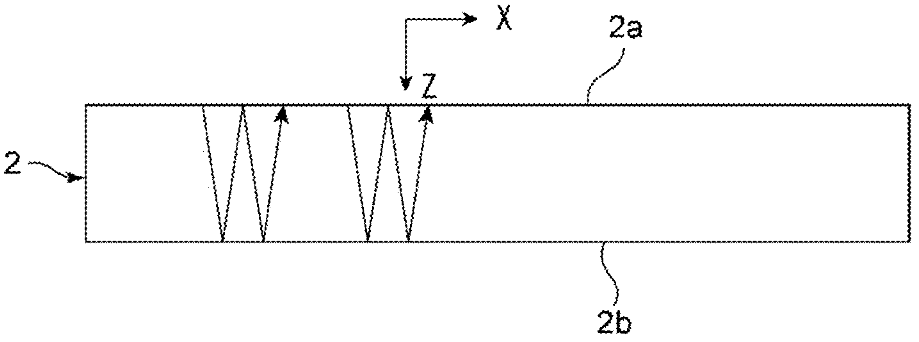
FIG. 11B is a schematic front sectional view for explaining a bulk wave in a thickness shear mode propagating through the piezoelectric film in the acoustic wave device.

On the other hand, as illustrated in FIG. 11B, in the acoustic wave device 1, since vibration displacement is in a thickness shear direction, a wave substantially propagates in a direction in which the first main surface 2*a* and the second main surface 2*b* of the piezoelectric layer 2 are connected, that is, in the Z direction, and resonates. That is, an X direction component of the wave is significantly smaller than a Z direction component. Then, resonance characteristics are obtained by the propagation of the wave in the Z direction, thus a propagation loss is less likely to occur even when the number of electrode fingers of the reflector is reduced. Furthermore, even when the number of pairs of electrodes including the electrodes 3 and 4 is reduced in order to further reduce the size, the Q factor is less likely to decrease.

Figure 12:
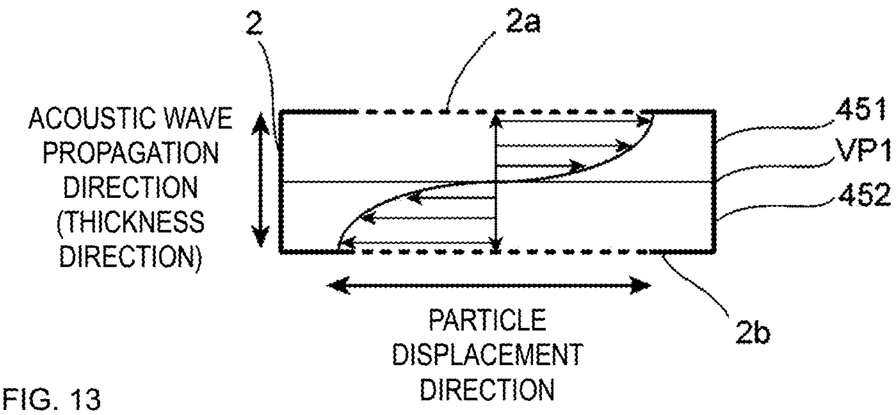
FIG. 12 is a diagram illustrating an amplitude direction of a bulk wave in a thickness shear mode.

Note that as illustrated in FIG. 12, an amplitude direction of a bulk wave in a thickness shear mode is reversed between a first region 451 included in the excitation region C of the piezoelectric layer 2 and a second region 452 included in the excitation region C. FIG. 12 schematically illustrates a bulk wave when a voltage is applied between the electrode 3 and the electrode 4 such that the electrode 4 has a higher potential than that of the electrode 3. The first region 451 is a region, of the excitation region C, between the first main surface 2*a* and a virtual plane VP1 that is orthogonal to the thickness direction of the piezoelectric layer 2 and divides the piezoelectric layer 2 into two parts. The second region 452 is a region, of the excitation region C, between the virtual plane VP1 and the second main surface 2*b*.

As described above, in the acoustic wave device 1, at least one pair of electrodes including the electrode 3 and the electrode 4 are disposed, but a wave is not propagated in the X direction, thus the number of pairs of electrodes including the electrodes 3 and 4 does not need to be plural. That is, it is sufficient that at least one pair of electrodes are provided.

For example, the above-described electrode 3 is an electrode connected to a hot potential, and the electrode 4 is an electrode connected to a ground potential. However, the electrode 3 may be connected to the ground potential and the electrode 4 may be connected to the hot potential. In the present preferred embodiment, as described above, electrodes included in at least one pair of electrodes are each an electrode connected to the hot potential or the ground potential, and a floating electrode is not provided.

Figure 13:
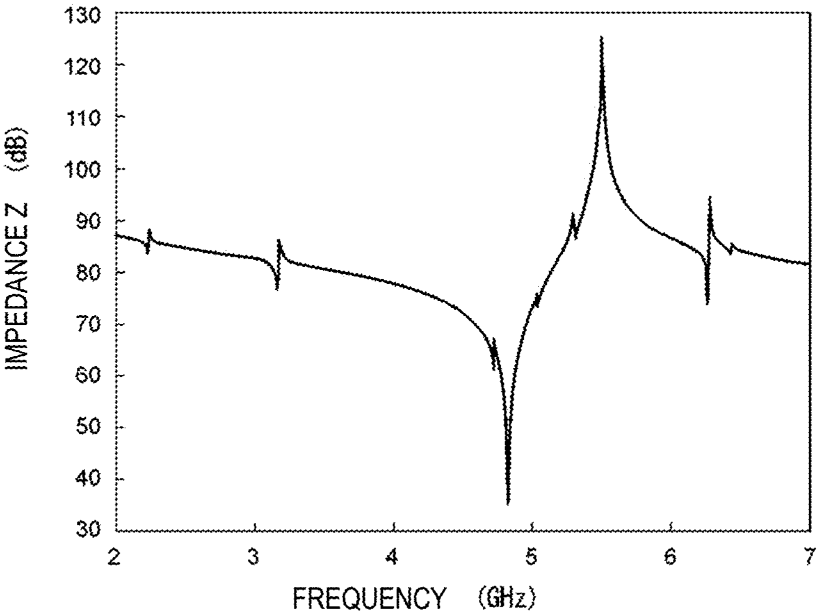
FIG. 13 is a graph showing resonance characteristics of an acoustic wave device in which a bulk wave in a thickness shear mode is used.

FIG. 13 is a graph showing resonance characteristics of the acoustic wave device illustrated in FIG. 10. Note that design parameters of an example of the acoustic wave device 1 for which these resonance characteristics were obtained are as follows.

Piezoelectric layer 2: $LiNbO_3$ of Euler angles (0°,0°, 90°), thickness=about 400 nm.

When viewed in the direction orthogonal to the length direction of the electrodes 3 and 4, a length of a region where the electrodes 3 and 4 overlap, that is, a length of the excitation region C=about 40 μm, the number of pairs of electrodes including the electrodes 3 and 4=21, a center-to-center distance between the electrodes=about 3 μm, widths of the electrodes 3 and 4=about 500 nm, and d/p=about 0.133.

Insulating layer 7: silicon oxide film having a thickness of about 1 μm.

Support member 8: Si.

Note that the length of the excitation region C is a dimension of the excitation region C along the length direction of the electrodes 3 and 4.

In the present preferred embodiment, an inter-electrode distance in the electrode pair including the electrodes 3 and 4 is all made equal for a plurality of pairs. That is, the electrodes 3 and the electrodes 4 were disposed at equal pitches.

As is clear from FIG. 13, good resonance characteristics with a fractional bandwidth of about 12.5% are obtained even though no reflector is provided, for example.

Incidentally, when the thickness of the piezoelectric layer 2 described above is d and the electrode center-to-center distance between the electrodes 3 and 4 is p, d/p is equal to or less than about 0.5, and more preferably equal to or less than about 0.24 in the present preferred embodiment as described above, for example. This will be described with reference to FIG. 14.

Figure 14:
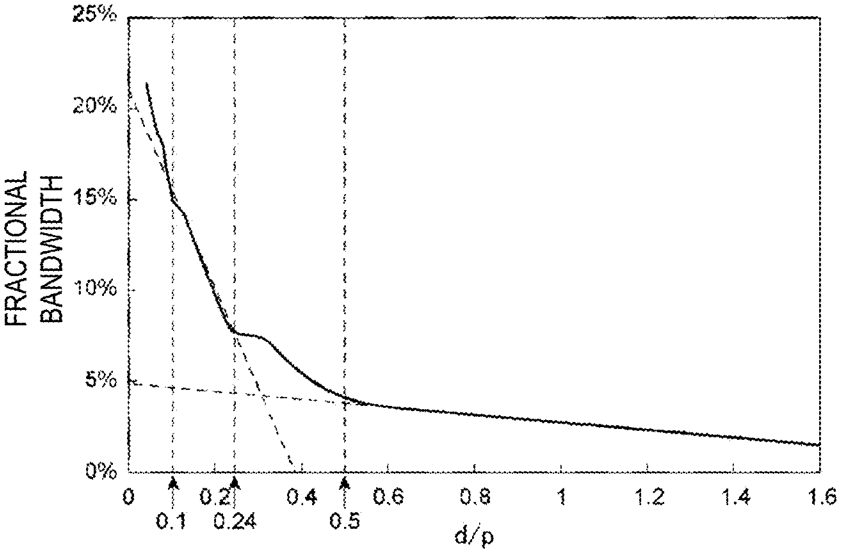
FIG. 14 is a graph showing a relationship between d/p and a fractional bandwidth as a resonator, where p is a center-to-center distance between adjacent electrodes and d is a thickness of a piezoelectric layer.

A plurality of acoustic wave devices was obtained in the same manner as the acoustic wave device for which the resonance characteristics shown in FIG. 13 were obtained, except that d/p was changed. FIG. 14 is a graph showing a relationship between this d/p and a fractional bandwidth of the acoustic wave device as a resonator.

As is clear from FIG. 14, when d/p>about 0.5, the fractional bandwidth is less than about 5% even when d/p is adjusted, for example. On the other hand, when d/p≤about 0.5, by changing d/p within the range, the fractional bandwidth can be set to equal to or greater than about 5%, for example, that is, a resonator having a high coupling coefficient can be formed. Further, when d/p is equal to or less than about 0.24, the fractional bandwidth can be increased to equal to or greater than about 7%, for example. In addition, when d/p is adjusted within this range, a resonator having a wider fractional bandwidth can be obtained, and a resonator having a higher coupling coefficient can be achieved. Thus, it is understood that by setting d/p to equal to or less than about 0.5, for example, a resonator having a high coupling coefficient in which the above-described bulk wave in the thickness shear mode is used can be formed.

Figure 15:
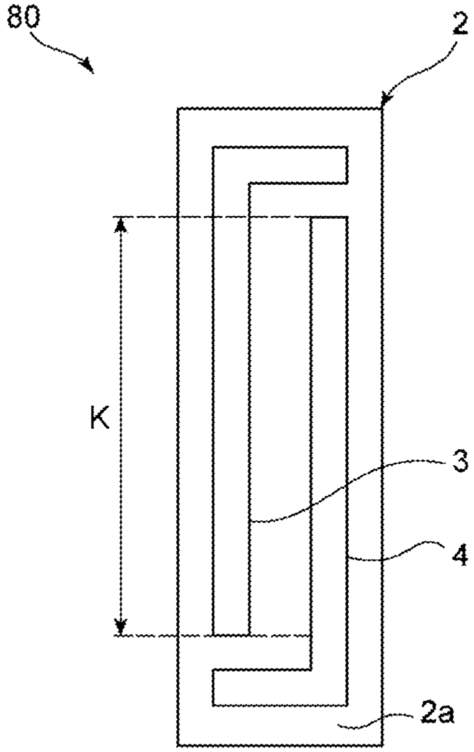
FIG. 15 is a plan view of an acoustic wave device in which a bulk wave in a thickness shear mode is used.

FIG. 15 is a plan view of an acoustic wave device in which a bulk wave in a thickness shear mode is used. In an acoustic wave device 80, a pair of electrodes having the electrode 3 and the electrode 4 are provided on the first main surface 2*a* of the piezoelectric layer 2. Note that K in FIG. 15 indicates an intersecting width. As described above, in an acoustic wave device according to a preferred embodiment of the present invention, the number of pairs of electrodes may be one. Also in this case, as long as d/p is equal to or less than about 0.5, a bulk wave in a thickness shear mode can be effectively excited.

Figure 16:
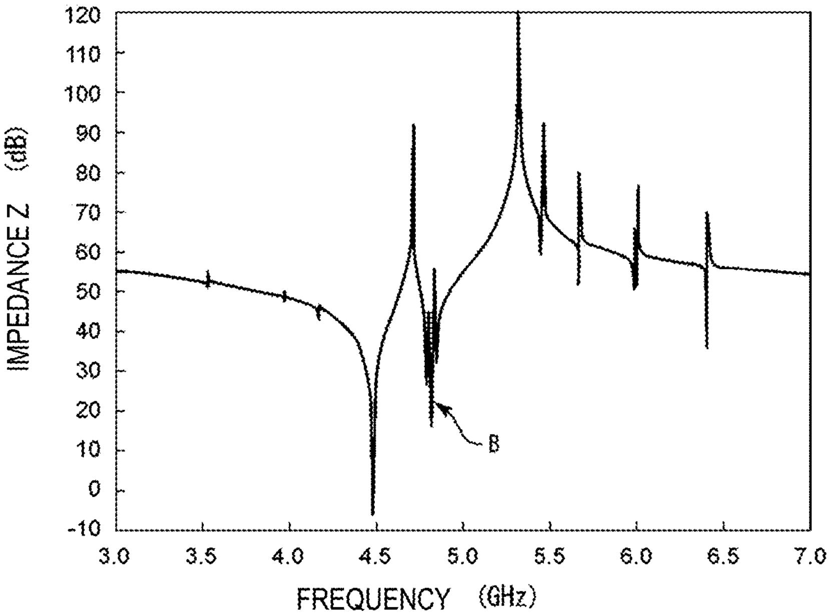
FIG. 16 is a graph showing resonance characteristics of an acoustic wave device of a reference example in which a spurious mode appears.

It is desirable that, in the acoustic wave device 1, preferably, in the plurality of electrodes 3 and 4, relative to the excitation region C, which is a region in which any adjacent electrodes 3 and 4 overlap when viewed in a facing direction, a metallization ratio MR of the above adjacent electrodes 3 and 4 satisfies MR about 1.75(d/p)+0.075, for example. In this case, a spurious mode can be effectively reduced. This will be described with reference to FIG. 16 and FIG. 17. FIG. 16 is a reference diagram illustrating an example of resonance characteristics of the above described acoustic wave device 1. A spurious mode indicated by an arrow B appears between a resonant frequency and an anti-resonant frequency. Note that d/p=about 0.08 was set and Euler angles of $LiNbO_3$ were set to (0°, 0°, 90°), for example. Further, the metallization ratio MR was about 0.35, for example.

The metallization ratio MR will be explained with reference to FIG. 9B. When attention is paid to one pair of electrodes 3 and 4 in an electrode structure of FIG. 9B, it is assumed that only this pair of electrodes 3 and 4 are provided. In this case, a portion surrounded by an alternate long and short dash line is the excitation region C. The excitation region C is a region of the electrode 3 overlapping the electrode 4, a region of the electrode 4 overlapping the electrode 3, and a region in which the electrode 3 and the electrode 4 overlap each other in a region between the electrode 3 and the electrode 4, when the electrode 3 and the electrode 4 are viewed in the direction orthogonal to the length direction of the electrodes 3 and 4, that is, in the facing direction. Areas of the electrodes 3 and 4 in the excitation region C relative to an area of the excitation region C derive the metallization ratio MR. That is, the metallization ratio MR is a ratio of an area of a metallization portion to the area of the excitation region C.

Note that when a plurality of pairs of electrodes is provided, it is sufficient that a ratio of metallization portions included in all excitation regions to a sum of areas of the excitation regions is adopted as MR.

Figure 17:
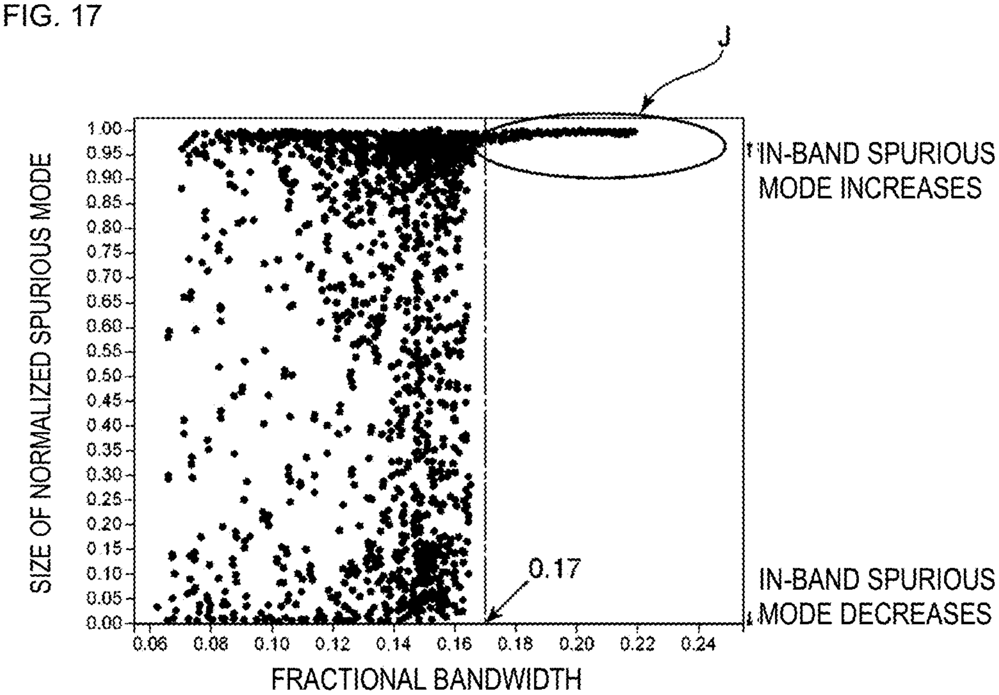
FIG. 17 is a graph showing a relationship between a fractional bandwidth and a phase rotation amount of impedance of a spurious mode normalized by 180 degrees as a size of the spurious mode.

FIG. 17 is a graph showing a relationship between a fractional bandwidth and a phase rotation amount of impedance of a spurious mode normalized by 180 degrees as a size of the spurious mode, when a large number of acoustic wave resonators are provided according to the present preferred embodiment. Note that the fractional bandwidth was adjusted by variously changing a thickness of a piezoelectric layer and a dimension of an electrode. Additionally, FIG. 17 shows a result in a case where the piezoelectric layer formed of Z-cut $LiNbO_3$ is used, but even a case where a piezoelectric layer having another cut angle is used results in a similar tendency.

In a region surrounded by an ellipse J in FIG. 17, the spurious mode is as large as about 1.0, for example. As is clear from FIG. 17, when the fractional bandwidth exceeds about 0.17, that is, when the fractional bandwidth exceeds about 17%, for example, a large spurious mode having a spurious level of equal to or greater than 1 appears in a pass band even when parameters constituting the fractional bandwidth are changed. That is, as in the resonance characteristics shown in FIG. 16, a large spurious mode indicated by the arrow B appears in the band. Thus, the fractional bandwidth is preferably equal to or less than about 17%, for example. In this case, the spurious mode can be reduced by adjusting the thickness of the piezoelectric layer 2, the dimensions of the electrodes 3 and 4, and the like.

Figure 18:
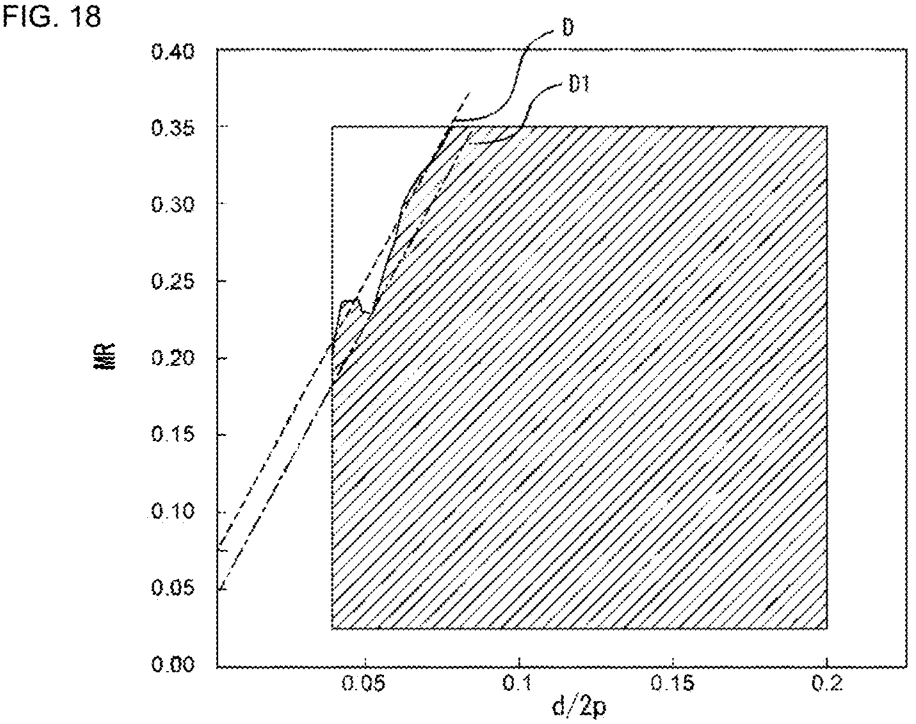
FIG. 18 is a graph showing a relationship between d/2p and a metallization ratio MR.

FIG. 18 is a graph showing a relationship among d/2p, the metallization ratio MR and a fractional bandwidth. In the above-described acoustic wave device, various acoustic wave devices different in d/2*p* and MR were formed, and a fractional bandwidth was measured. A hatched portion on a right side of a broken line D in FIG. 18 is a region in which the fractional bandwidth is equal to or less than about 17%, for example. A boundary between the hatched region and a non-hatched region is represented by MR=about 3.5(d/2p)+0.075, for example. That is, MR=about 1.75(d/p)+0.075, for example. Thus, preferably, MR about 1.75(d/p)+0.075, for example. In this case, it is easy to set the fractional bandwidth to equal to or less than about 17%, for example. A region on a right side of MR=about 3.5(d/2p)+0.05, for example, indicated by an alternate long and short dash line D1 in FIG. 18 is more preferable. That is, as long as MR≤about 1.75(d/p)+0.05, the fractional bandwidth can be reliably set to equal to or less than about 17%, for example.

Figure 19:
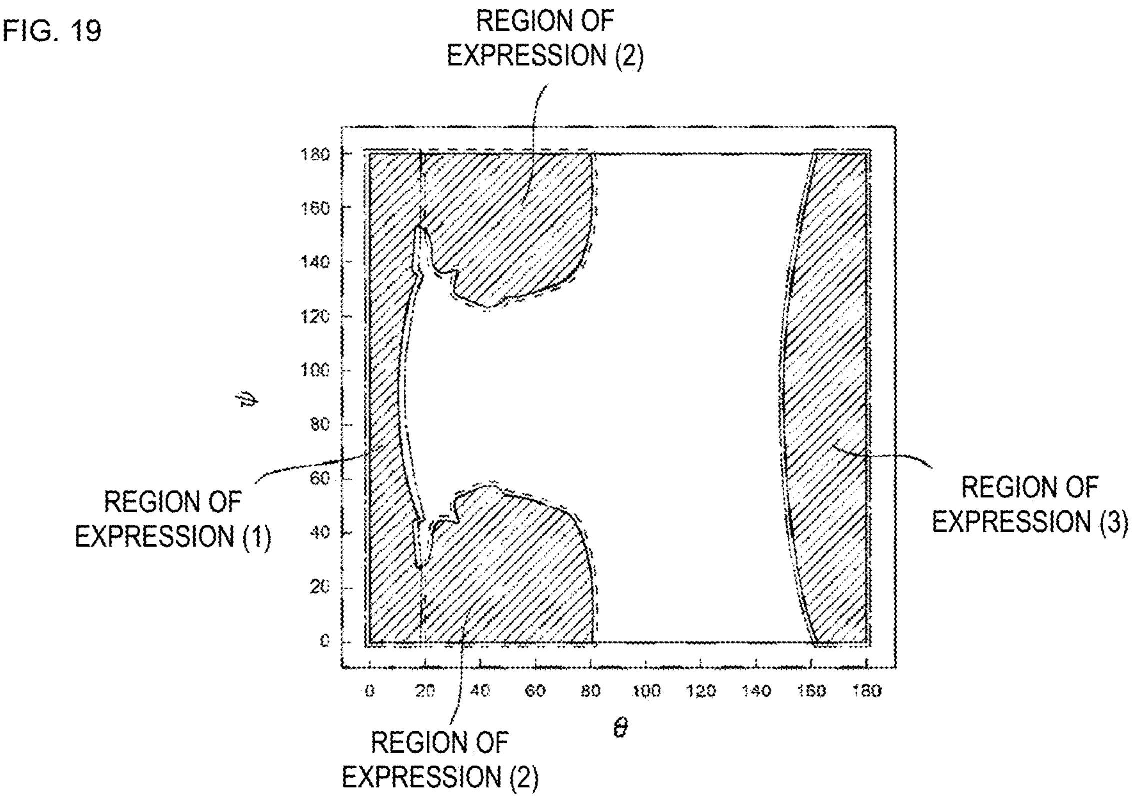
FIG. 19 is a graph showing a map of a fractional bandwidth relative to Euler angles (0°, θ, ψ) of $LiNbO_3$ when d/p is made as close to 0 as possible.

FIG. 19 is a graph showing a map of a fractional bandwidth relative to Euler angles (0°, θ, ψ) of $LiNbO_3$ when d/p is made as close to 0 as possible. Hatched portions in FIG. 19 are regions in which a fractional bandwidth of at least equal to or greater than about 5% is obtained, for example, and when ranges of the regions are approximated, ranges represented by the following Expression (1), Expression (2) and Expression (3) are obtained.

$$(0°\pm10°, 0° \text{ to } 20°, \text{any } \psi) \quad \text{Expression (1)}$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(\theta-50)^2/900)^{1/2}] \text{ to } 180°) \quad \text{Expression(2)}$$

$$(0°\pm10°, [180°-30°(1-(\psi-90)^2/8100)^{1/2}] \text{ to } 180°, \text{any } \psi) \quad \text{Expression (3)}$$

Thus, in the case of the Euler angle range of the above Expression (1), Expression (2) or Expression (3), the fractional bandwidth can be sufficiently widened, which is preferable. The same applies to a case where the piezoelectric layer 2 is a lithium tantalate layer.

Figure 20:
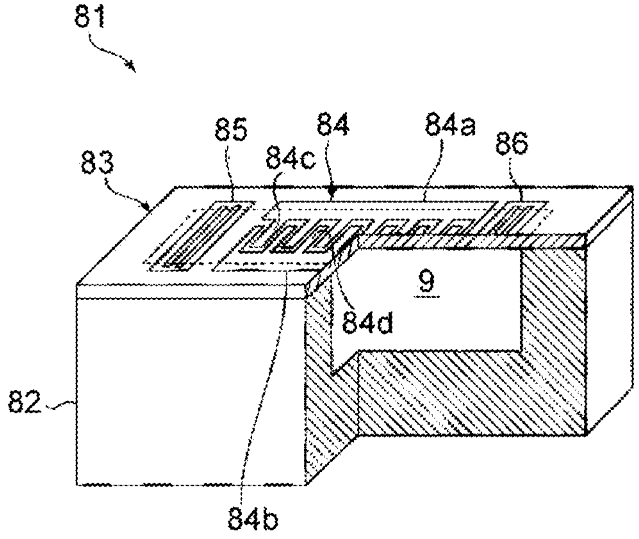
FIG. 20 is a partially cutaway perspective view for explaining an acoustic wave device in which a Lamb wave is used.

FIG. 20 is a partially cutaway perspective view for explaining an acoustic wave device in which a Lamb wave is used.

An acoustic wave device 81 has a support substrate 82. The support substrate 82 is provided with a recess that is open to an upper surface. A piezoelectric layer 83 is laminated on the support substrate 82. Thus, the cavity portion 9 is formed. An IDT electrode 84 is provided on the piezoelectric layer 83 above the cavity portion 9. Reflectors 85 and 86 are provided on both sides in an acoustic wave propagation direction of the IDT electrode 84. In FIG. 20, an outer peripheral edge of the cavity portion 9 is indicated by a broken line. Here, the IDT electrode 84 has first and second busbars 84*a* and 84*b*, a plurality of first electrode fingers 84*c* and a plurality of second electrode fingers 84*d*. The plurality of first electrode fingers 84*c* is connected to the first busbar 84*a*. The plurality of second electrode fingers 84*d* is connected to the second busbar 84*b*. The plurality of first electrode fingers 84*c* and the plurality of second electrode fingers 84*d* are interdigitated with each other.

In the acoustic wave device 81, a Lamb wave as a plate wave is excited by applying an alternating electric field to the IDT electrode 84 on the cavity portion 9. Then, the reflectors 85 and 86 are provided on both sides, thus resonance characteristics due to the above Lamb wave can be obtained.

As described above, acoustic wave devices according to preferred embodiments of the present invention may be one in which a plate wave is used. In this case, it is sufficient that the IDT electrode 84, the reflector 85 and the reflector 86 illustrated in FIG. 20 are provided on the piezoelectric layer in the above first to fourth preferred embodiments or the modification.

In the acoustic wave device of the first to fourth preferred embodiments or the modification having the acoustic wave resonator in which a bulk wave in a thickness shear mode is used, as described above, d/p is preferably equal to or less than about 0.5, and more preferably equal to or less than about 0.24, for example. Accordingly, even better resonance characteristics can be obtained. Furthermore, in the acoustic wave device of the first to fourth preferred embodiments or the modification having the acoustic wave resonator in which a bulk wave in a thickness shear mode is used, MR about 1.75(d/p)+0.075, for example, is preferably satisfied as described above. In this case, a spurious mode can be more reliably reduced or prevented.

The piezoelectric layer in the acoustic wave device of the first to fourth preferred embodiments or the modification having the acoustic wave resonator in which a bulk wave in a thickness shear mode is used is preferably a lithium niobate layer or a lithium tantalate layer. Then, the Euler angles (p, θ, ψ) of lithium niobate or lithium tantalate forming the piezoelectric layer are preferably in the range of the above Expression (1), Expression (2) or Expression (3). In this case, a fractional bandwidth can be sufficiently widened.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:

a piezoelectric substrate including a support and a piezoelectric layer, the support including a support substrate, the piezoelectric layer being provided on the support and including a first main surface and a second main surface opposed to each other;

one or more functional electrodes provided on the first main surface or the second main surface of the piezoelectric layer, and including at least one pair of electrodes;

a first support provided on the piezoelectric substrate so as to surround the functional electrodes;

one or more second supports provided on the piezoelectric substrate, and located on a portion surrounded by the first support; and a cover provided on the first support and the second supports; wherein a direction in which the electrodes adjacent to each other face each other is an electrode facing direction, and a region in which the electrodes adjacent to each other overlap each other when viewed from the electrode facing direction is an intersecting region; and a direction in which the at least one pair of electrodes extend is an electrode extending direction, and the second supports at least partially overlap the intersecting region when viewed from the electrode extending direction.

2. The acoustic wave device according to claim 1, further comprising:

a plurality of the functional electrodes; wherein a plurality of resonators each including the functional electrodes is provided; and at least one of the second supports is between two of the resonators.

3. The acoustic wave device according to claim 2, wherein the plurality of resonators includes a plurality of resonators with a split structure; and at least one of the second supports is between two of the resonators with a split structure.

4. The acoustic wave device according to claim 1, further comprising:

a plurality of the functional electrodes; wherein a plurality of resonators each including the functional electrodes is provided; and at least one of the second supports is located on a portion other than an interval between two of the resonators, on the piezoelectric substrate.

5. The acoustic wave device according to claim 1, wherein at least one of the second supports is electrically connected to the functional electrodes.

6. The acoustic wave device according to claim 1, further comprising:

a plurality of the functional electrodes; and a plurality of the second supports; wherein a plurality of resonators each including the functional electrodes is provided; and at least one pair of the second supports sandwich one of the resonators.

7. The acoustic wave device according to claim 6, wherein the plurality of resonators includes one or more series arm resonators and one or more parallel arm resonators; and at least one pair of the second supports sandwich one of the series arm resonators.

8. The acoustic wave device according to claim 6, wherein the plurality of resonators includes one or more series arm resonators and one or more parallel arm resonators; and at least one pair of the second supports sandwich one of the parallel arm resonators.

9. The acoustic wave device according to claim 6, wherein at least one pair of the second supports sandwich the resonators closest to an input end to which a signal is inputted.

10. The acoustic wave device according to claim 6, wherein when an axis passing through a center of the intersecting region of the resonators in the electrode extending direction and extending in the electrode facing direction is a symmetric axis, the at least one pair of second supports sandwich the one of the resonators are not line-symmetric.

11. The acoustic wave device according to claim 1, wherein a wiring electrode is provided between at least one of the second supports and at least one of the resonators.

12. The acoustic wave device according to claim 1, wherein at least one first cavity portion is provided in the support and at least partially overlaps the functional electrodes in plan view;

a second cavity portion surrounded by the piezoelectric substrate, the first support and the cover is provided; and when a dimension along a direction in which the piezoelectric substrate, the first support and the cover are laminated is a height, a height of the first cavity portion is greater than a height of the second cavity portion.

13. The acoustic wave device according to claim 12, wherein the support includes an intermediate layer between the support substrate and the piezoelectric layer, and the first cavity portion is at least partially provided in the intermediate layer.

14. The acoustic wave device according to claim 1, wherein at least one first cavity portion is provided in the support and at least partially overlaps the functional electrodes in plan view;

a second cavity portion surrounded by the piezoelectric substrate, the first support and the cover is provided; and when a dimension along a direction in which the piezoelectric substrate, the first support and the cover are laminated is a height, a height of the second cavity portion is greater than a height of the first cavity portion.

15. The acoustic wave device according to claim 1, wherein the support includes an intermediate layer between the support substrate and the piezoelectric layer.

16. The acoustic wave device according to claim 1, wherein the cover includes a cover body including a semiconductor as a main component.

17. The acoustic wave device according to claim 1, wherein the piezoelectric layer is a lithium tantalate layer or a lithium niobate layer.

18. The acoustic wave device according to claim 1, wherein the functional electrodes each include first and second busbars facing each other, one or more first electrode fingers connected to the first busbar, and one or more second electrode fingers connected to the second busbar.

19. The acoustic wave device according to claim 18, wherein the functional electrodes are each an IDT electrode including a plurality of the first electrode fingers and a plurality of the second electrode fingers.

20. The acoustic wave device according to claim 19, wherein the acoustic wave device is structured to generate a plate wave.

21. The acoustic wave device according to claim 18, wherein the acoustic wave device is structured to generate a bulk wave in a thickness shear mode.

22. The acoustic wave device according to claim 21, wherein $MR \leq$ about $1.75(d/p)+0.075$ is satisfied; where a region in which the first and second electrode fingers adjacent to each other overlap each other when viewed from the electrode facing direction is an excitation region; and MR is a metallization ratio of the one or more first electrode fingers and the one or more second electrode fingers relative to the excitation region.

23. The acoustic wave device according to claim 21, wherein the piezoelectric layer is a lithium tantalate layer or a lithium niobate layer; and Euler angles ($\varphi$, $\theta$, $\psi$) of lithium niobate or lithium tantalate of the piezoelectric layer are within a range of Expression (1), Expression (2) or Expression (3):

$$(0°\pm10°, 0° \text{ to } 20°, \text{any } \psi) \qquad \text{Expression (1)}$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(\theta-50)^2/900)^{1/2}] \text{ to } 180°) \qquad \text{Expression(2)}$$

$$(0°\pm10°, [180°-30°(1-(\psi-90)^2/8100)^{1/2}] \text{ to } 180°, \text{any } \psi) \qquad \text{Expression (3)}$$

24. The acoustic wave device according to claim 18, wherein d/p is equal to or less than about 0.5, where d is a thickness of the piezoelectric layer, and p is an electrode finger center-to-center distance between the first and second electrode fingers adjacent to each other.

25. The acoustic wave device according to claim 24, wherein d/p is equal to or less than about 0.24.

* * * * *